US012580533B2

(12) United States Patent
Jee et al.

(10) Patent No.: US 12,580,533 B2
(45) Date of Patent: Mar. 17, 2026

(54) POWER AMPLIFIER AND ELECTRONIC DEVICE INCLUDING THE SAME

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Seunghoon Jee, Suwon-si (KR); Youngoo Yang, Suwon-si (KR); Yifei Chen, Suwon-si (KR); Hyunuk Kang, Suwon-si (KR); Kyoungtae Kim, Suwon-si (KR); Changwook Kim, Suwon-si (KR); Youngyoon Woo, Suwon-si (KR); Woojin Choi, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 405 days.

(21) Appl. No.: 18/168,223

(22) Filed: Feb. 13, 2023

(65) Prior Publication Data

US 2023/0198480 A1      Jun. 22, 2023

Related U.S. Application Data

(63) Continuation of application No. PCT/KR2022/019389, filed on Dec. 1, 2022.

(30) Foreign Application Priority Data

Dec. 1, 2021 (KR) ........................ 10-2021-0170212
Dec. 30, 2021 (KR) ........................ 10-2021-0193286

(51) Int. Cl.
H03F 3/21    (2006.01)
H03F 1/02    (2006.01)
H03F 1/56    (2006.01)

(52) U.S. Cl.
CPC ........... *H03F 3/211* (2013.01); *H03F 1/0288* (2013.01); *H03F 1/565* (2013.01); *H03F 2200/387* (2013.01); *H03F 2200/451* (2013.01)

(58) Field of Classification Search
CPC ........ H03F 3/211; H03F 1/0288; H03F 1/565; H03F 2200/387; H03F 2200/451
(Continued)

(56) References Cited

U.S. PATENT DOCUMENTS 7,973,600 B2    7/2011  Yu
8,022,760 B2    9/2011  Gajadharsing et al.
(Continued)

FOREIGN PATENT DOCUMENTS

CN      108599727 A    9/2018
JP      2011-035754 A    2/2011
(Continued)

OTHER PUBLICATIONS

Kaymaksut et al.,"CMOS Transformer-Based Uneven Doherty Power Amplifier for WLAN Applications", IEEE 2011 (Year: 2011).*
(Continued)

*Primary Examiner* — Hafizur Rahman
(74) *Attorney, Agent, or Firm* — Jefferson IP Law, LLP

(57) ABSTRACT

The disclosure relates to a 5th generation (5G) or a pre-5G communication system for supporting a higher data transmission rate after a 4th generation (4G) communication system such as long-term evolution (LTE). A Doherty power amplifier of a wireless communication system is provided. The Doherty power amplifier includes a first power amplifier, a second power amplifier, a first transmission line
(Continued)

connected to an output end of the first power amplifier, a second transmission line connected to an input end of the second power amplifier, a first network, and a second network, the first network may interconnect a first node connected with one end of the first transmission line and a second node connected with an output end of the second power amplifier, the one end of the first transmission line may be positioned on an opposite side with respect to the output end of the first power amplifier, and the second network may connect the first node, the second node, and a third node which is an output end of the Doherty power amplifier.

20 Claims, 18 Drawing Sheets

(58) Field of Classification Search
USPC .......................................................... 330/295
See application file for complete search history.

(56) References Cited

U.S. PATENT DOCUMENTS

| | | | |
|---|---|---|---|
| 8,188,789 | B2 | 5/2012 | Woo et al. |
| 8,305,141 | B2 | 11/2012 | Jeong et al. |
| 8,340,606 | B2 | 12/2012 | Park et al. |
| 8,368,465 | B2 | 2/2013 | Kim et al. |
| 10,389,311 | B1 | 8/2019 | Kobayashi |
| 10,972,055 | B2 * | 4/2021 | Naraine ............... H01Q 21/065 |
| 11,005,433 | B2 * | 5/2021 | Li ........................... H03F 3/005 |
| 11,201,592 | B2 | 12/2021 | Ahn et al. |
| 11,304,134 | B2 * | 4/2022 | Wang .................... H03F 1/0288 |
| 12,301,171 | B2 * | 5/2025 | Naraine ................ H01Q 9/045 |
| 2004/0056723 | A1 | 3/2004 | Gotou |
| 2011/0025412 | A1 | 2/2011 | Matsunaga |
| 2011/0204974 | A1 | 8/2011 | Woo et al. |
| 2016/0028351 | A1 | 1/2016 | Jin et al. |
| 2019/0089311 | A1 * | 3/2019 | Gomez ............... H03F 3/45475 |
| 2020/0014337 | A1 | 1/2020 | Scott et al. |
| 2020/0153389 | A1 | 5/2020 | Gaynor |
| 2022/0109405 | A1 * | 4/2022 | Khalili .................... H03F 3/005 |
| 2023/0046261 | A1 * | 2/2023 | Yu ........................... H03F 3/195 |
| 2024/0063757 | A1 * | 2/2024 | Naraine ................ H03F 3/245 |

FOREIGN PATENT DOCUMENTS

| | | |
|---|---|---|
| KR | 10-2007-0000257 A | 1/2007 |
| KR | 10-0749870 B1 | 8/2007 |
| KR | 10-2010-0094589 A | 8/2010 |
| KR | 10-2011-0085340 A | 7/2011 |
| KR | 10-2011-0097246 A | 8/2011 |
| KR | 10-1128486 B1 | 3/2012 |
| KR | 10-1934933 B1 | 1/2019 |
| KR | 10-2019-0093113 A | 8/2019 |
| KR | 10-2020-0094535 A | 8/2020 |
| KR | 10-2165176 B1 | 10/2020 |
| KR | 10-2023-0007556 A | 1/2023 |
| KR | 10-2023-0022356 A | 2/2023 |
| WO | 2019084911 A1 | 5/2019 |
| WO | 2021/021934 A1 | 2/2021 |

OTHER PUBLICATIONS

International Search Report dated Mar. 17, 2023, issued in International Patent Application No. PCT/KR2022/019389.

Extended European Search Report dated Dec. 18, 2024, issued in European Application No. 22901834.6-1201.

Lyu et al.; Balanced-to-Doherty Mode-Reconfigurable Power Amplifier With High Efficiency and Linearity Against Load Mismatch; IEEE Transactions on Microwave Theory and Techniques, vol. 68, No. 5, May 2020.

Korean Office Action dated Dec. 24, 2025, issued in Korean Patent Application No. 10-2021-0193286.

Indian Office Action dated Jan. 20, 2026, issued in Indian Patent Application No. 202417048396.

* cited by examiner

[Low Power Operation]

POWER AMPLIFIER AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/019389, filed on Dec. 1, 2022, which is based on and claims the benefit of a Korean patent application number 10-2021-0170212, filed on Dec. 1, 2021, in the Korean Intellectual Property Office, and of a Korean patent application number 10-2021-0193286, filed on Dec. 30, 2021, in the Korean Intellectual Property Office, the disclosure of each of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) RESEARCH & BUSINESS FOUNDATION SUNGKYUNKWAN UNIVERSITY.

TECHNICAL FIELD

The disclosure relates to a wireless communication system. More particularly, the disclosure relates to a power amplifier and an electronic device including the same in the wireless communication system.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post long term evolution (LTE) System'.

The 5G communication system is considered to be implemented in higher frequency (mm Wave) bands, for example, 28 GHz or 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beamforming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (COMP), reception-end interference cancellation and the like.

In the 5G system, Hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

An electronic device may use a modulation scheme having a high peak to average power ratio (PAPR) to process considerable data capacity in the 5G system. To linearly amplify a modulation signal having a high PAPR, a power amplifier operates in a back-off region which is backed off from a maximum output by a specific value instead of a region having the maximum output. In so doing, the power amplifier operating in the back-off region decreases in efficiency, and increases in power consumption. To improve the amplifier efficiency in the back-off region, a Doherty power amplifier including two power amplifiers may be used. However, the Doherty power amplifier is limited in the back-off region for improving the efficiency, and its efficiency improvement capability may be limited.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide a power amplifier structure for improving amplifier efficiency in a wider back-off region, using a Doherty power amplifier using a common mode in a wireless communication system.

Another aspect of the disclosure is to provide a power amplifier structure for amplifying a signal having a high peak to average power ratio (PAPR) with high efficiency, using a Doherty power amplifier using a common mode in a wireless communication system.

Another aspect of the disclosure is to provide a power amplifier structure for minimizing power consumption and heat, using a Doherty power amplifier using a common mode in a wireless communication system.

Additional aspects will be set forth in part in the description which follows and, in part, will be apparent from the description, or may be learned by practice of the presented embodiments.

Technical Solution

In accordance with an aspect of the disclosure, a Doherty power amplifier of a wireless communication system is provided. The Doherty power amplifier includes a first power amplifier, a second power amplifier, a first transmission line connected to an output end of the first power amplifier, a second transmission line connected to an input end of the second power amplifier, a first network, and a second network, the first network may interconnect a first node connected with one end of the first transmission line and a second node connected with an output end of the second power amplifier, the one end of the first transmission line may be positioned on an opposite side with respect to the output end of the first power amplifier, and the second network may connect the first node, the second node, and a third node which is an output end of the Doherty power amplifier.

In accordance with another aspect of the disclosure, an electronic device of a wireless communication system is provided. The electronic device includes at least one processor, a plurality of radio frequency (RF) chains connected with the at least one processor and a plurality of antenna elements connected with the plurality of the RF chains, a first RF chain of the plurality of the RF chains may include a Doherty power amplifier, the Doherty power amplifier may include a first power amplifier, a second power amplifier, a first transmission line connected to an output end of the first power amplifier, a second transmission line connected to an input end of the second power amplifier, and a first network and a second network, the first network may interconnect a first node connected with one end of the first transmission line and a second node connected with an output end of the second power amplifier, the one end of the first transmission line may be positioned on an opposite side with respect to the output end of the first power amplifier, and the second network may connect the first node, the second node, and a third node which is an output end of the Doherty power amplifier.

Advantageous Effects

An apparatus according to various embodiments of the disclosure, may improve amplifier efficiency in a wider back-off region, through a Doherty power amplifier using a common mode.

An apparatus according to various embodiments of the disclosure, may linearly amplify a modulation signal having a high peak to average power ratio (PAPR), and improve efficiency, through a Doherty power amplifier using a common mode.

An apparatus according to various embodiments of the disclosure, may minimize power consumption and heat of the apparatus, through a Doherty power amplifier using a common mode.

Other aspects, advantages, and salient features of the disclosure will become apparent to those skilled in the art from the following detailed descriptions, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

4

Figure 5A:
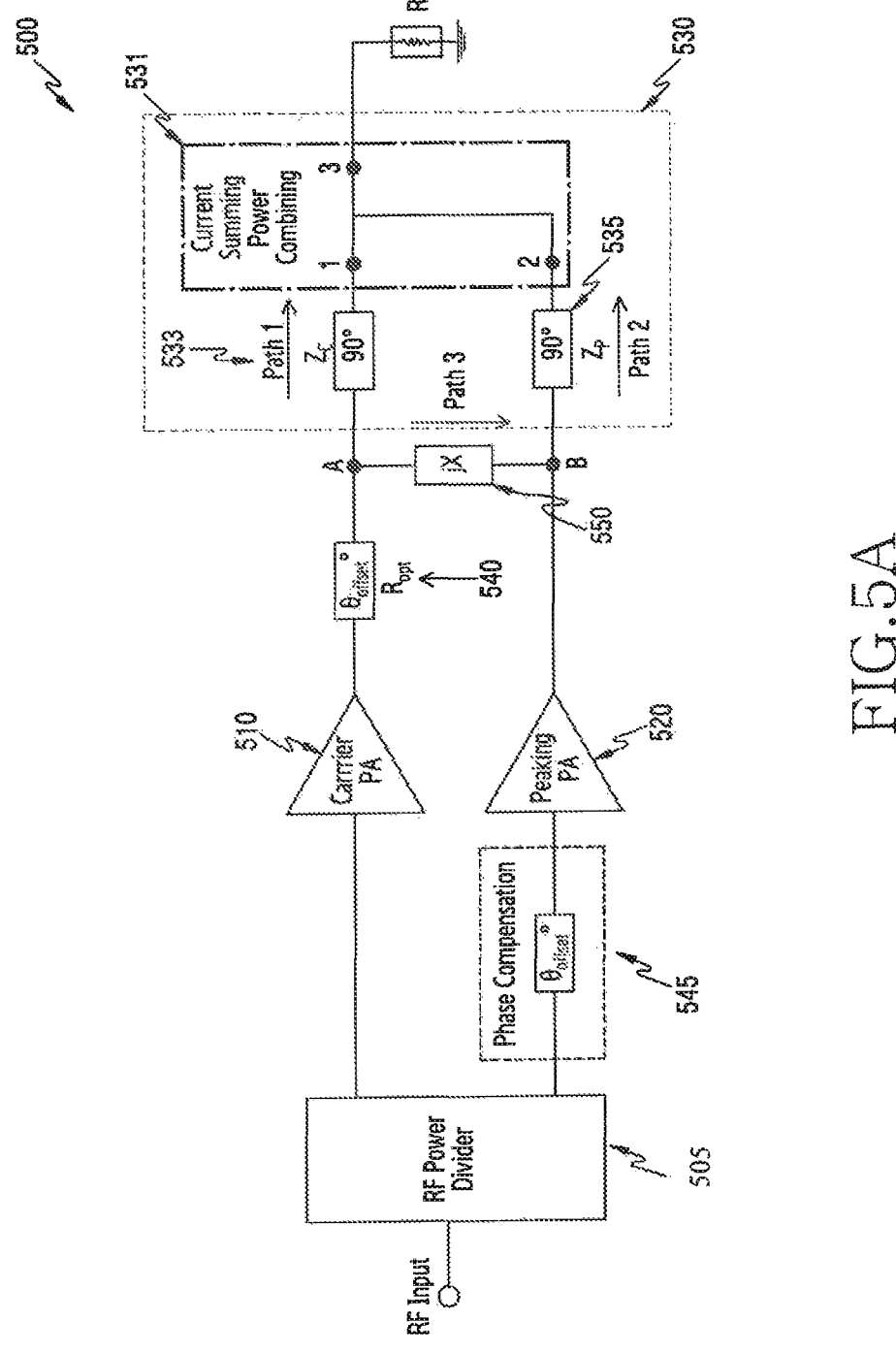
Figure 5B:
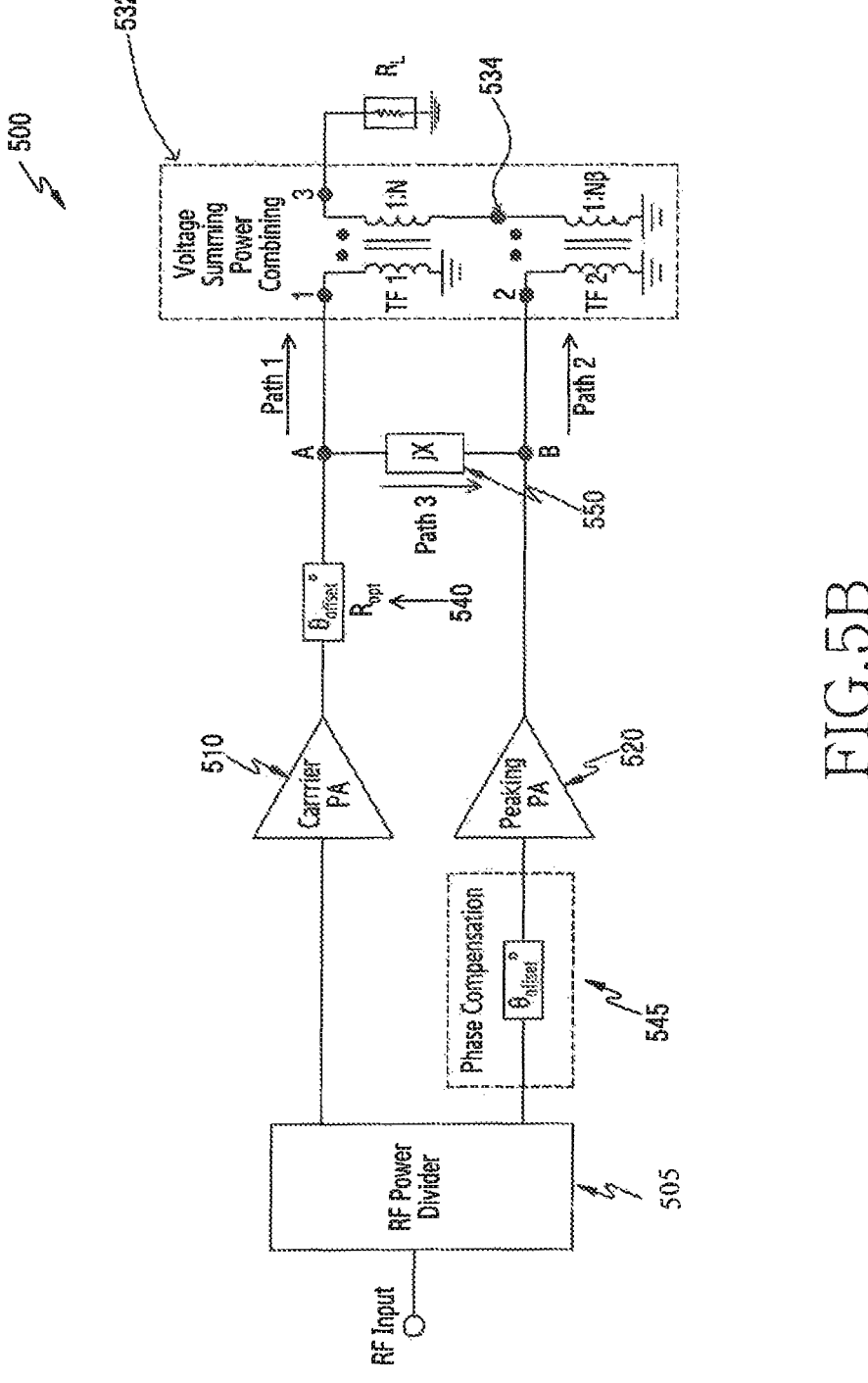
Figure 6A:
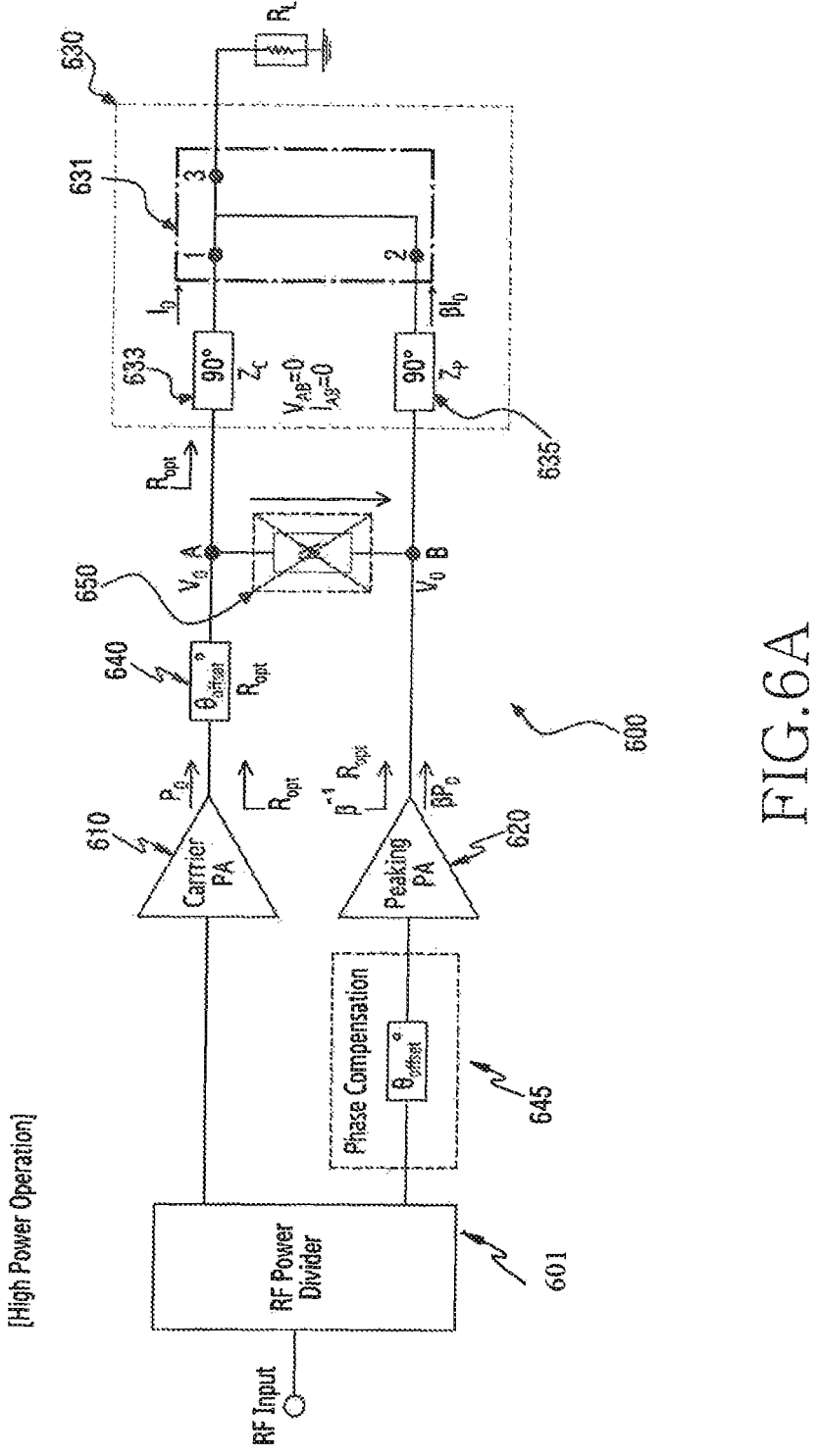
Figure 6B:
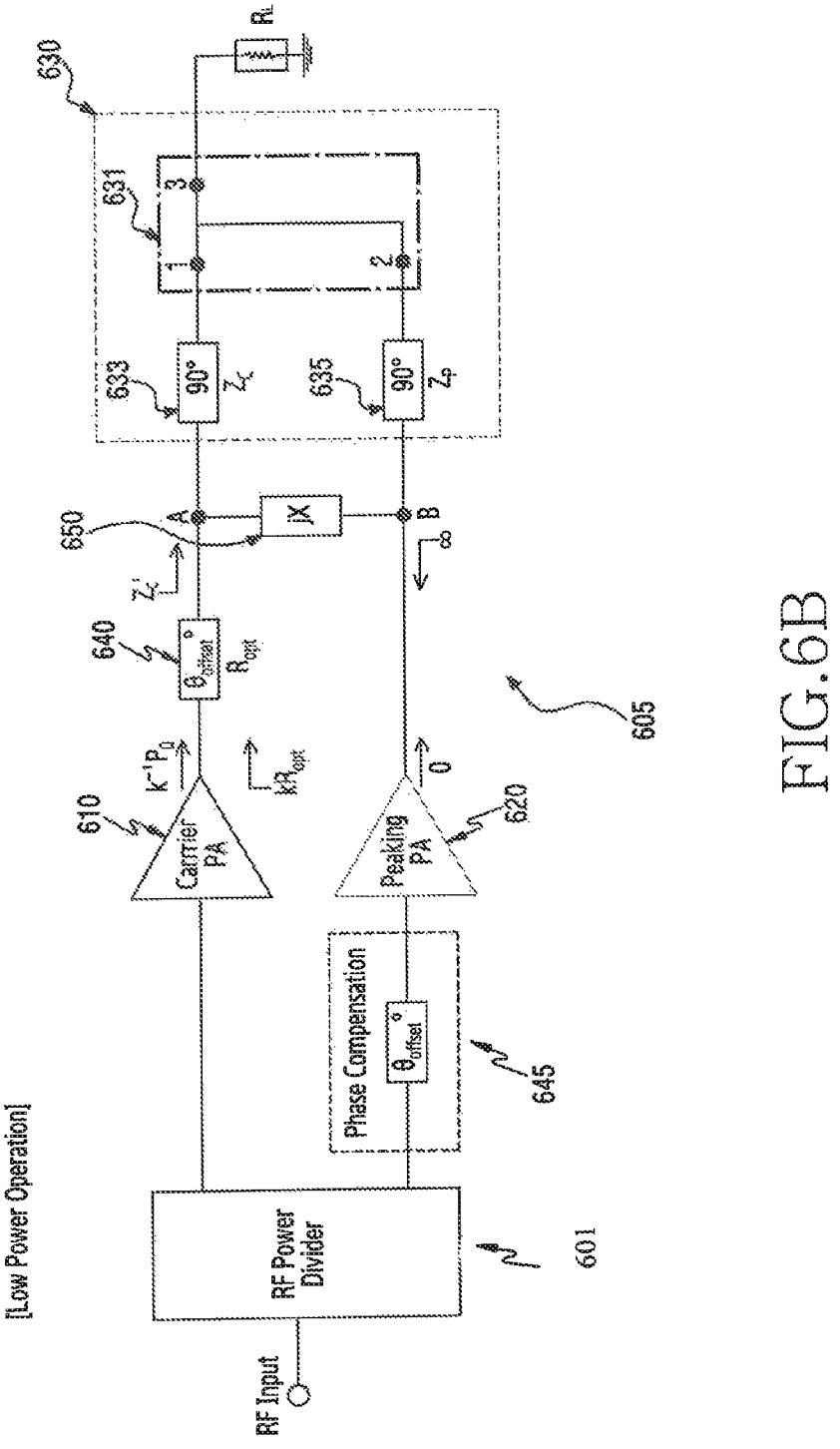
Figure 7A:
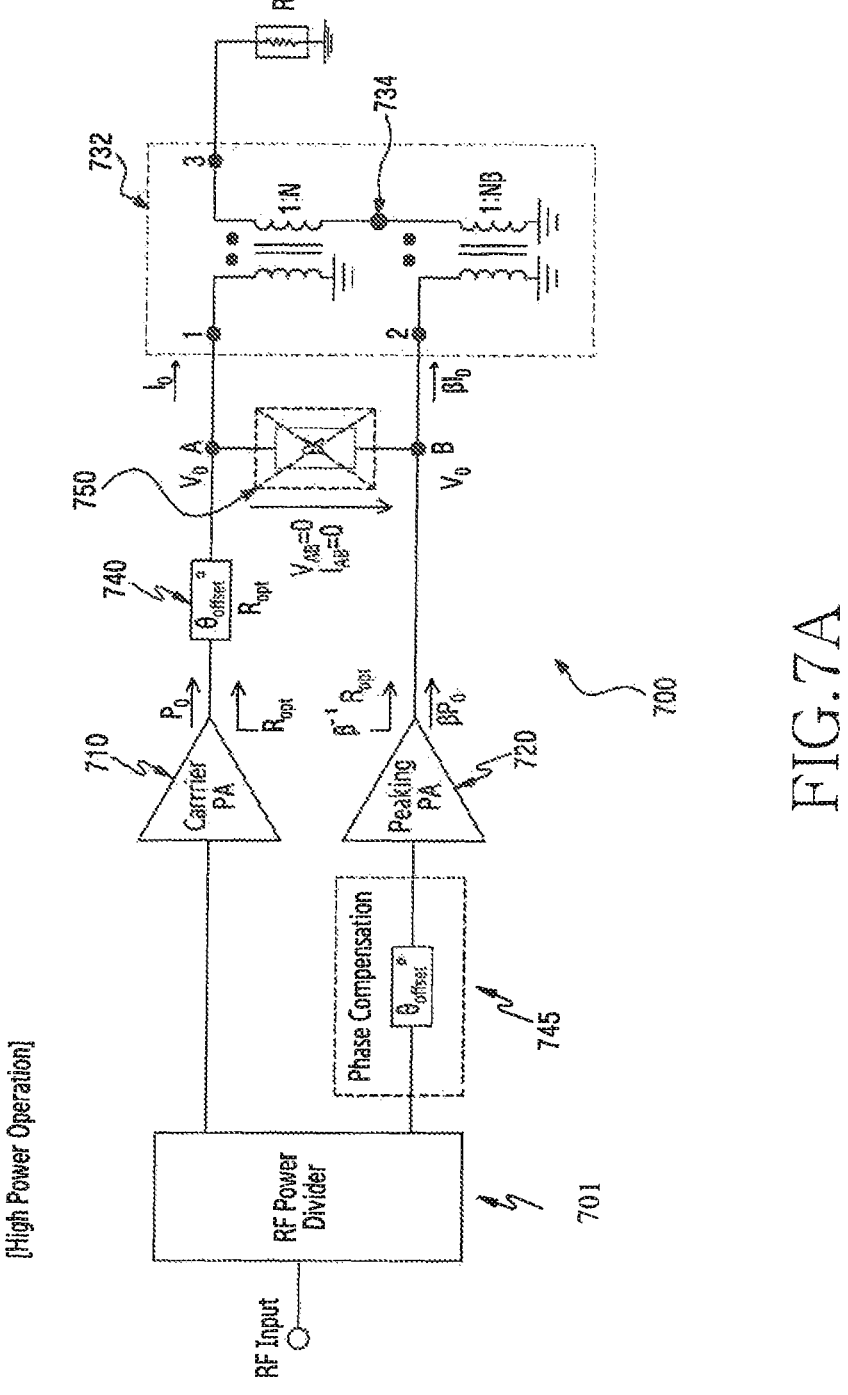
Figure 7B:
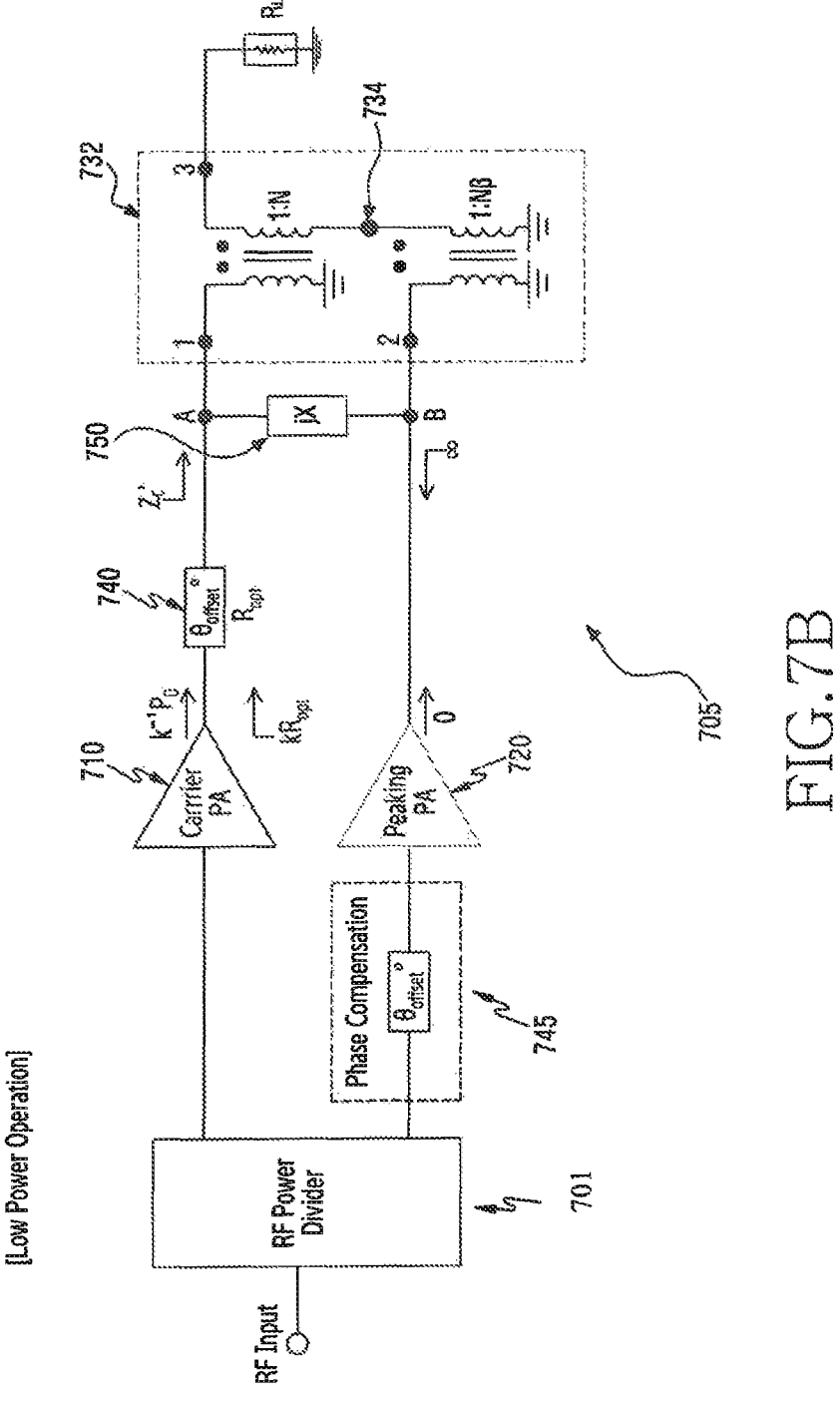
Figure 8A:
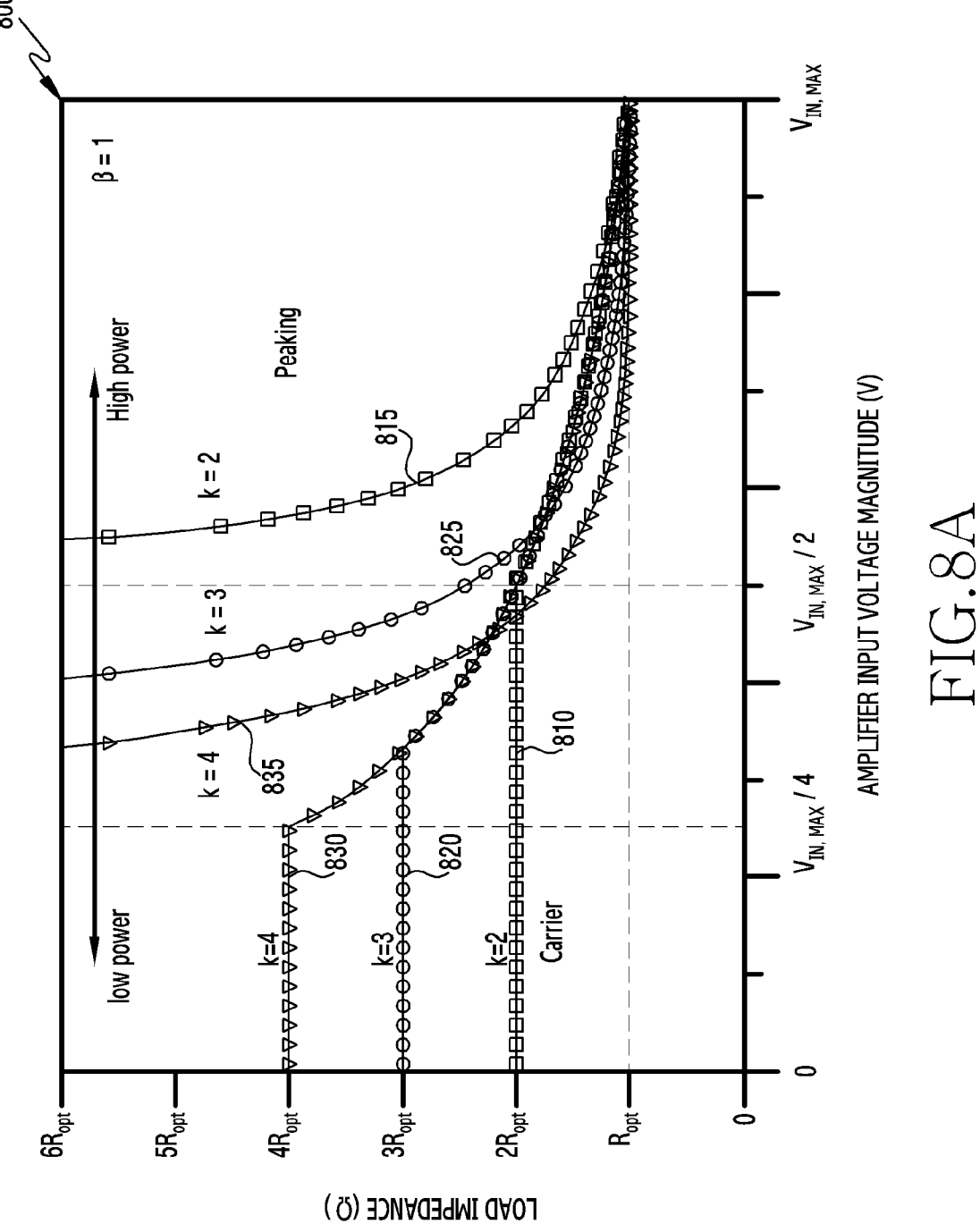
Figure 8B:
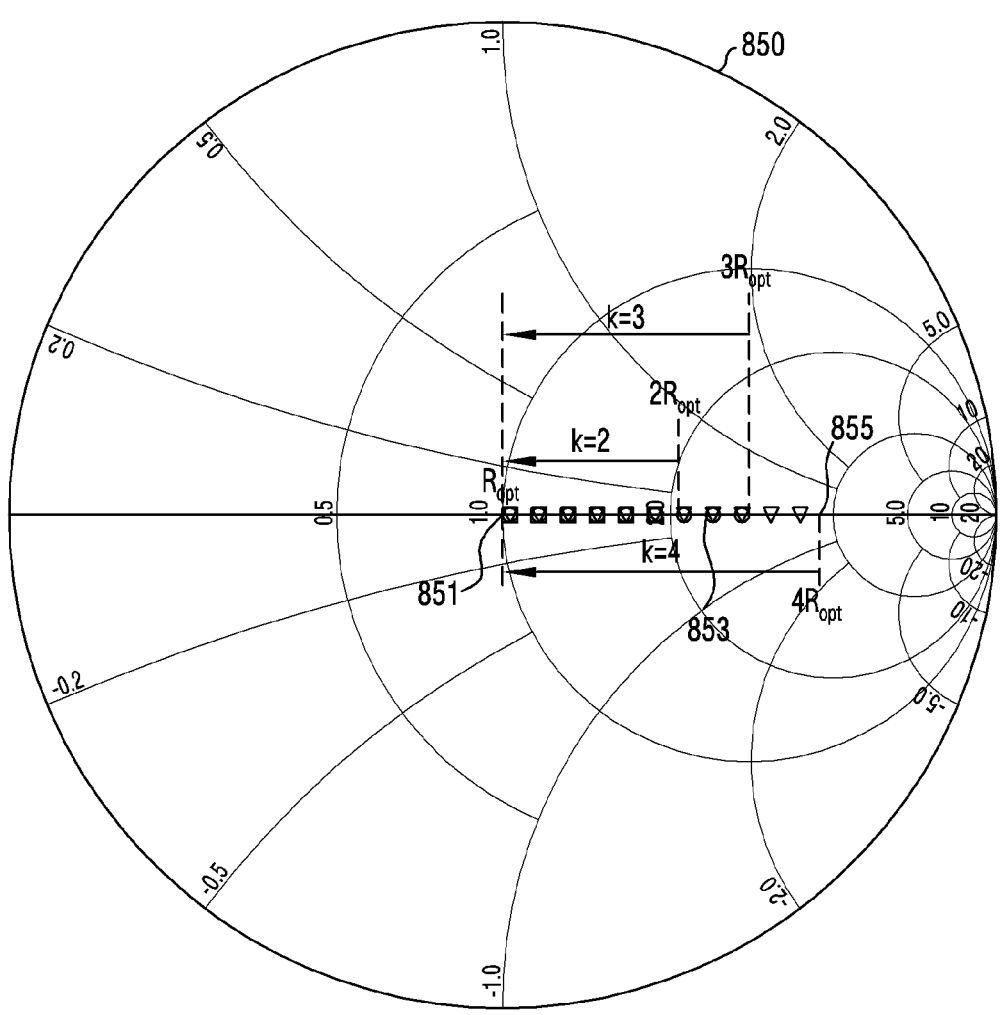
Figure 8C:
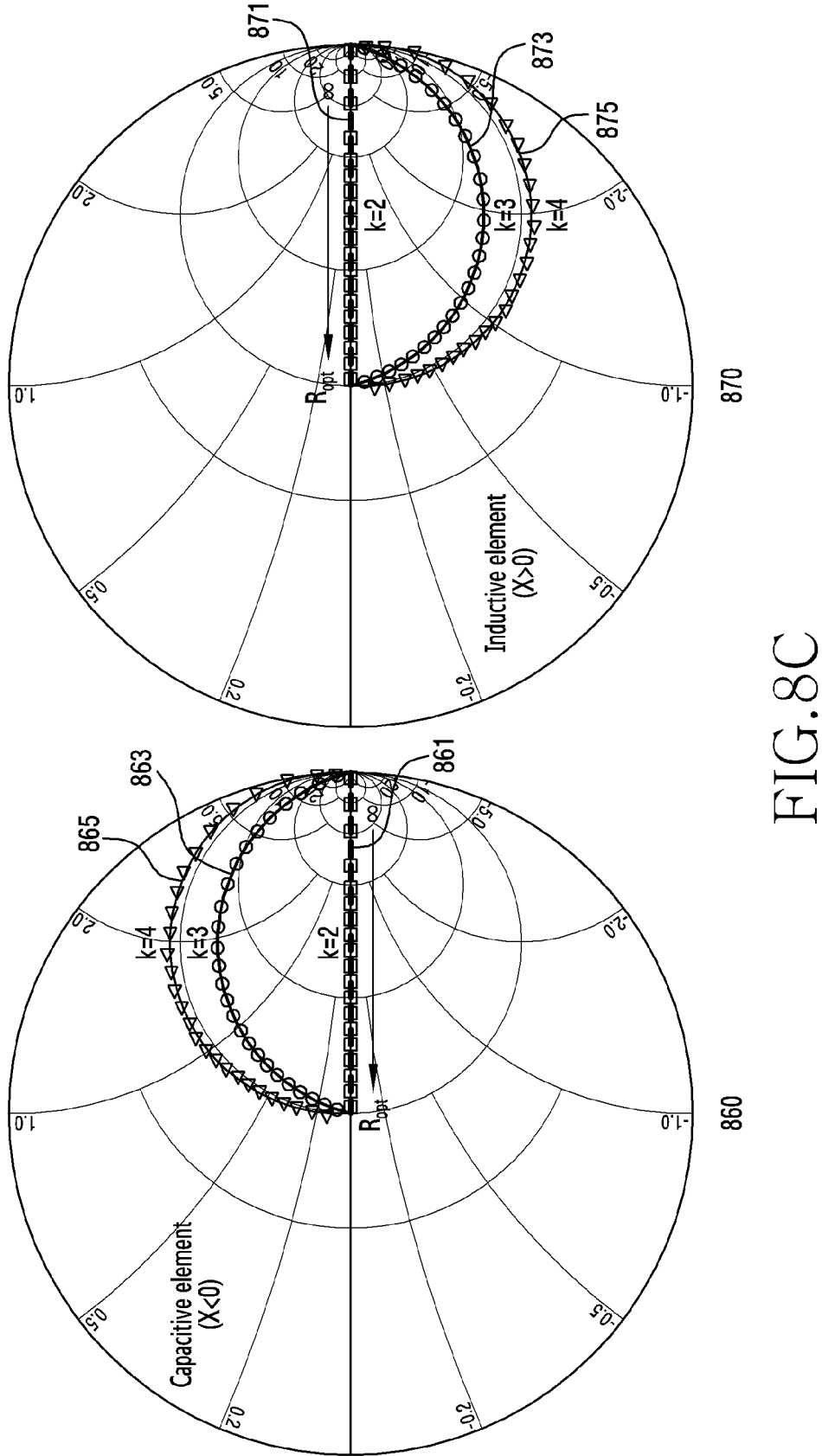
Figure 9:
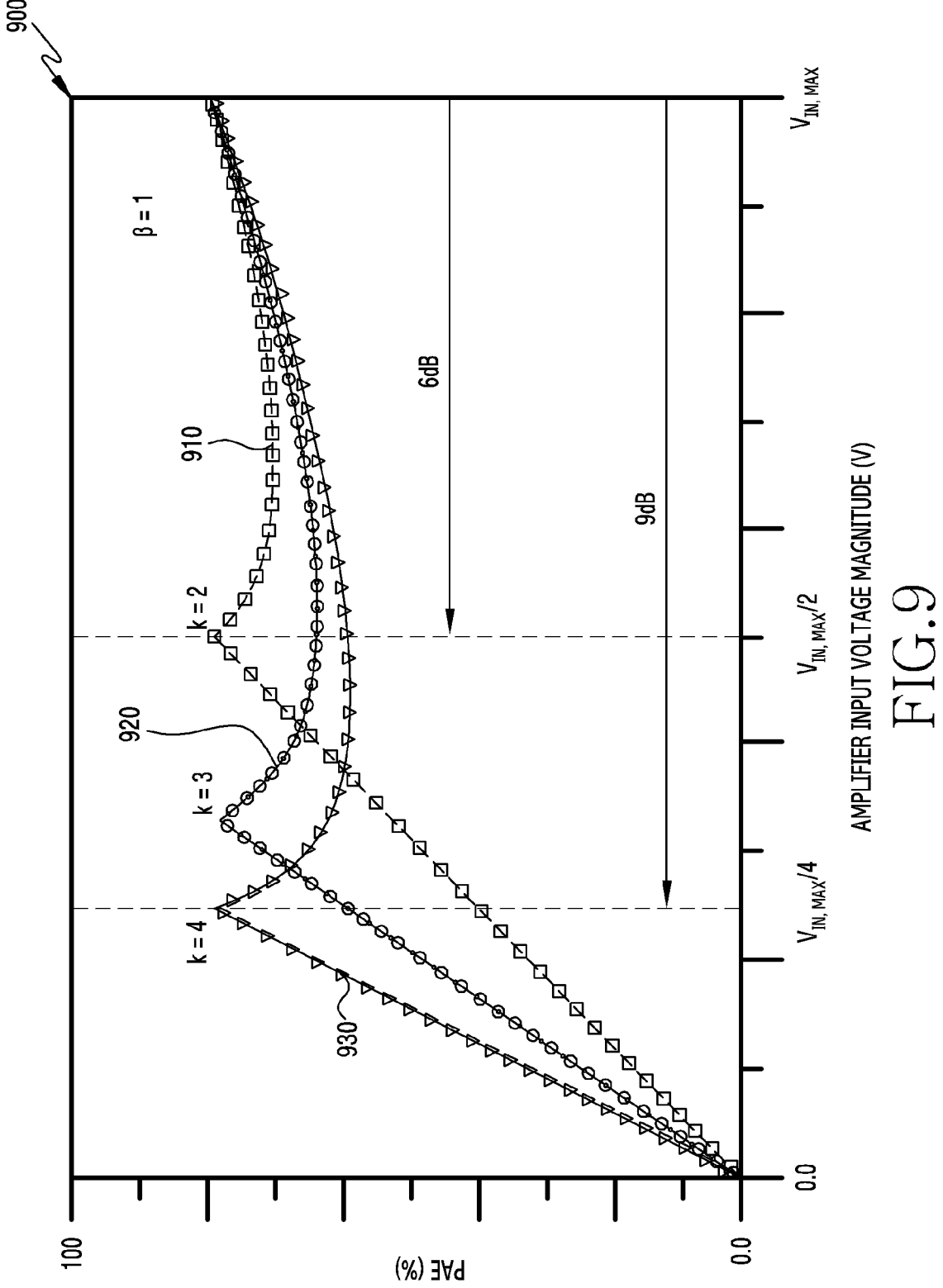
Figure 10:
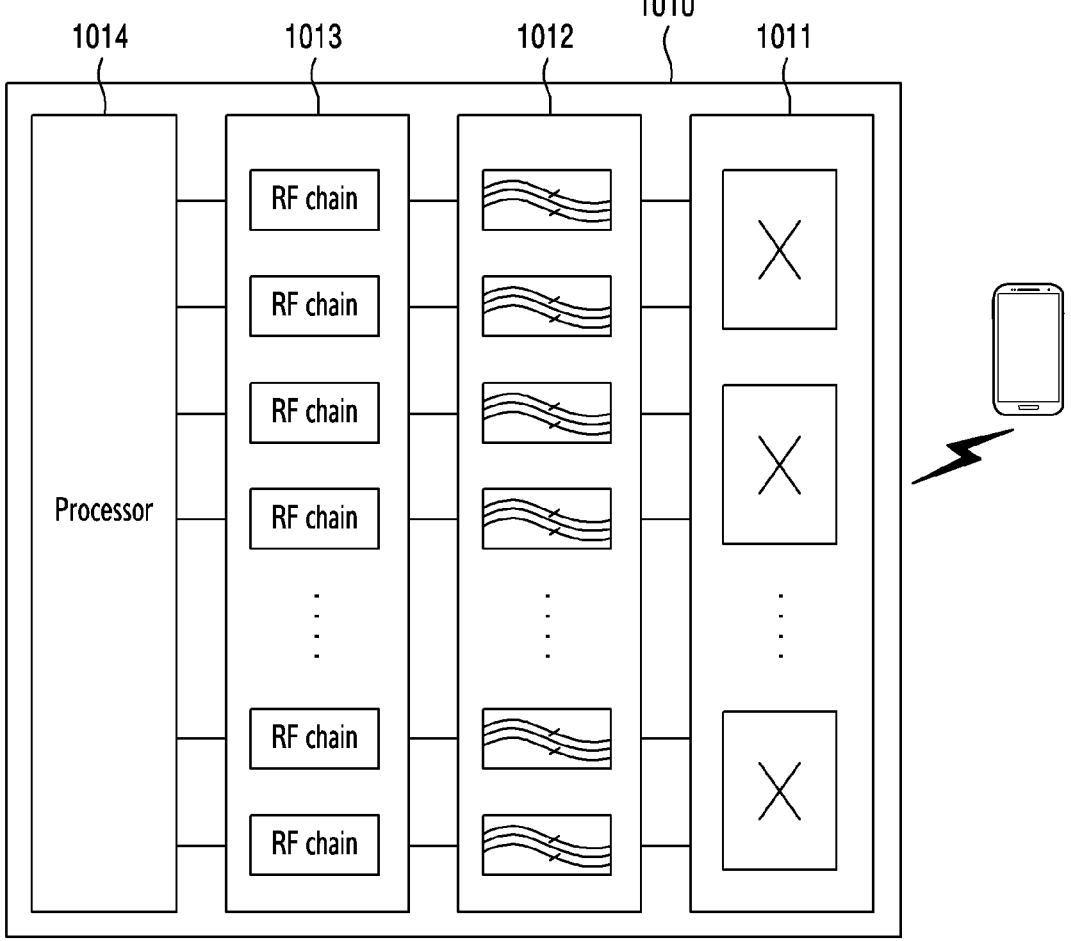

FIG. 5A illustrates an example of coupling between output ends of power amplifiers of a Doherty power amplifier using a common mode according to an embodiment of the disclosure;

FIG. 5B illustrates another example of coupling between output ends of power amplifiers of a Doherty power amplifier using a common mode according to an embodiment of the disclosure;

FIG. 6A illustrates an example of operations of a Doherty power amplifier using a common mode in a first state according to an embodiment of the disclosure;

FIG. 6B illustrates an example of operations of a Doherty power amplifier using a common mode in a second state according to an embodiment of the disclosure;

FIG. 7A illustrates another example of operations of a Doherty power amplifier using a common mode in a first state according to an embodiment of the disclosure;

FIG. 7B illustrates another example of operations of a Doherty power amplifier using a common mode in a second state according to an embodiment of the disclosure;

FIG. 8A is a graph illustrating examples of load impedance of a power amplifier based on an input voltage according to an embodiment of the disclosure;

FIG. 8B is a graph illustrating an example of load impedance change of a first power amplifier based on an input voltage according to an embodiment of the disclosure;

FIG. 8C is a graph illustrating an example of load impedance change of a second power amplifier based on an input voltage according to an embodiment of the disclosure;

FIG. 9 is a graph illustrating an example of PAE based on an input voltage of a Doherty power amplifier using a common mode according to an embodiment of the disclosure; and FIG. 10 illustrates a functional configuration of an electronic device according to an embodiment of the disclosure.

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

All terms used herein, including technical and scientific terms, may have the same meaning as those commonly understood by a person skilled in the art of the disclosure. Terms defined in a generally used dictionary among the terms used in the disclosure may be interpreted to have the meanings equal or similar to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Various embodiments of the disclosure to be described explain a hardware approach by way of example. However, since the various embodiments of the disclosure include a technology using both hardware and software, various embodiments of the disclosure do not exclude a software based approach.

The disclosure relates to an apparatus and a method for expanding a back-off power region improved in efficiency through a Doherty power amplifier using a common mode in a wireless communication system. Particularly, the disclosure explains a technique for improving amplifier efficiency in a wider back-off power region, by interconnecting power amplifiers of the Doherty power amplifier and using a common mode characteristic.

Terms indicating components of a device (a divider, a power divider, a line, a transmission line, a feeding line, a power amplifier, a Doherty power amplifier, a carrier amplifier, a main power amplifier, a main amplifier, a peaking amplifier, an auxiliary power amplifier, an auxiliary amplifier, a phase offset, a modulation impedance, a network, a common mode network, a matching network, a power combining network, a current combining network, a voltage combining network), and terms indicating a configuration of the components of the device (a port, a terminal, an end, an input end, an output end, a node) and so on, used in the following descriptions, are illustrated for the convenience of description. Accordingly, the disclosure is not limited to terms to be described, and other terms having equivalent technical meanings may be used.

Figure 1:
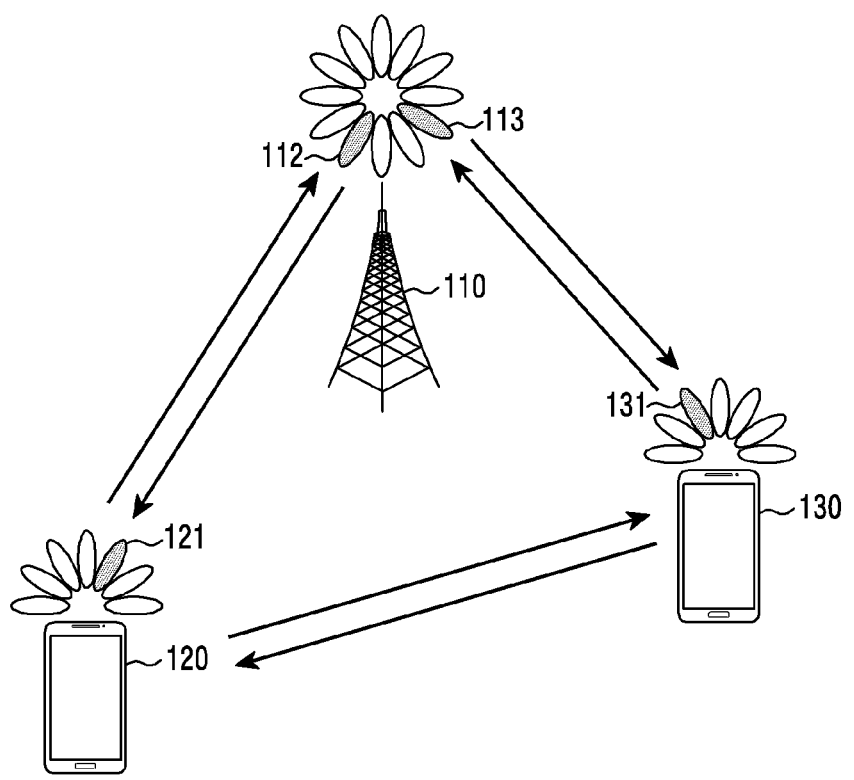
FIG. 1 illustrates an example of a wireless communication environment according to an embodiment of the disclosure.

FIG. 1 illustrates a wireless communication system according to an embodiment of the disclosure.

Referring to FIG. 1 a base station 110, a terminal 120, and a terminal 130, as some of nodes using radio channels in the wireless communication system. Although only one base station is illustrated, other base stations which are the same as or similar to the base station 110 may be further included.

The base station 110 is a network infrastructure which provides radio access to the terminals 120 and 130. The base station 110 has coverage defined as a specific geographic region based on a signal transmission distance. The base station 110 may be referred to as, beside the base station, an 'access point (AP)', an 'eNodeB (eNB)', a '5th generation node (5G node)', a 'wireless point', a 'transmission/reception point (TRP)', or other term having technically identical meaning.

The terminal 120 and the terminal 130 each are a device used by a user, and communicate with the base station 110 over a radio channel. In some cases, at least one of the terminal 120 or the terminal 130 may be operated without user's involvement. That is, at least one of the terminal 120 or the terminal 130 may be a device which performs machine type communication (MTC), and may not be carried by the user. The terminal 120 and the terminal 130 each may be referred to as, beside the terminal, a 'user equipment (UE)', a 'mobile station', a 'subscriber station', a 'customer premises equipment (CPE)', a 'remote terminal', a 'wireless terminal', an 'electronic device', or a 'user device', or other term having technically identical meaning.

The base station 110, the terminal 120, and the terminal 130 may transmit and receive radio signals in a millimeter wave (mmWave) band (e.g., 28 GHz, 30 GHZ, 38 GHz, 60 GHz). In so doing, to improve a channel gain, the base station 110, the terminal 120, and the terminal 130 may perform beamforming. The beamforming may include transmit beamforming and receive beamforming. That is, the base station 110, the terminal 120, and the terminal 130 may give directivity to a transmit signal or a receive signal. For doing so, the base station 110 and the terminals 120 and 130 may select serving beams 112, 113, 121, and 131 through beam search or beam management. After the serving beams 112, 113, 121, and 131 are selected, communications may be performed through resources which are quasi co-located (QCL) with resources transmitting the serving beams 112, 113, 121, and 131.

The base station 110 or the terminals 120 and 130 may include an antenna array. Each antenna included in the antenna array may be referred to as an array element, or an antenna element. The antenna array is depicted as a two-dimensional planar array in the disclosure, which is merely an embodiment, and does not limit other embodiments of the disclosure. The antenna array may be configured in various types, such as a linear array or a multi-layer array. The antenna array may be referred to as a massive antenna array. In addition, the antenna array may include a plurality of sub arrays including a plurality of antenna elements.

The disclosure describes using a network, a power combining network, a common mode network, and a matching network, but these expressions may indicate any component, a circuit or a circuit structure of a Doherty power amplifier. In addition, a node and a path may indicate a part such as a region or a point of the Doherty power amplifier.

Figure 2A:
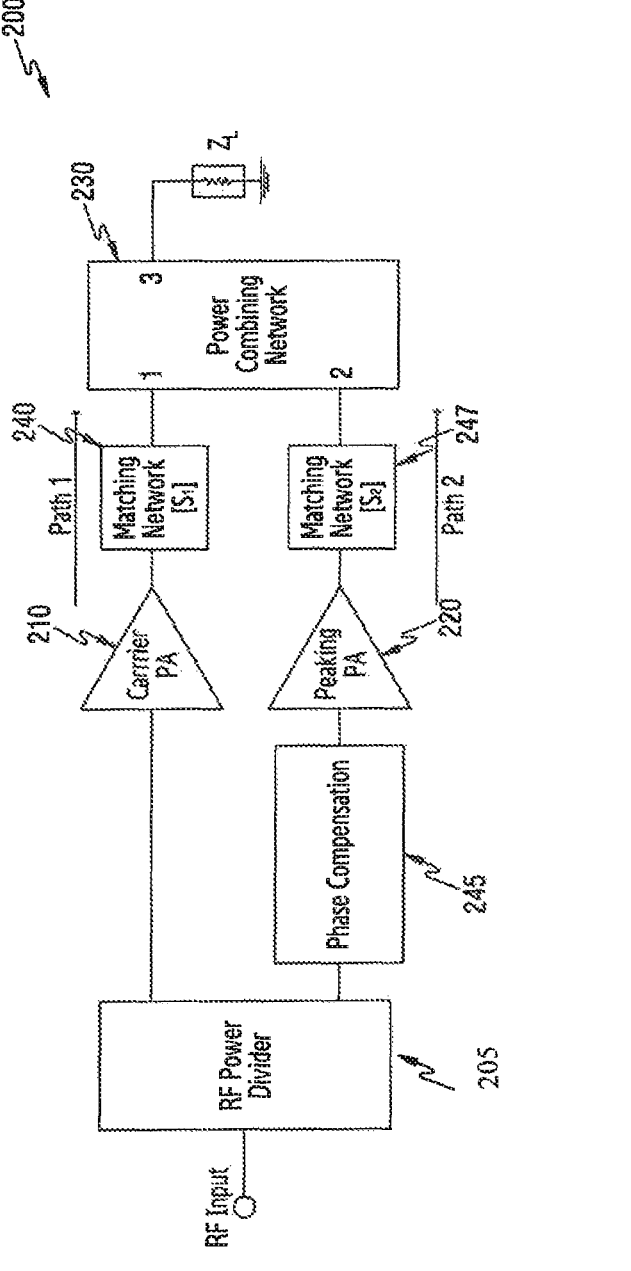
FIG. 2A illustrates an example of a Doherty power amplifier for describing according to an embodiment of the disclosure.

FIG. 2A illustrates an example of a Doherty power amplifier for describing according to an embodiment of the disclosure. The Doherty power amplifier may indicate a power amplifier structure for improving efficiency of a back-off region through load impedance modulation using two power amplifiers. At this time, the back-off region may indicate a region having a lower output by a specific value (or offset) in a maximum output region. In general, the power amplifier may operate in the back-off region for linear power amplification.

Referring to FIG. 2A, a Doherty power amplifier (DPA) 200 may include a power divider or a radio frequency (RF) power divider 205, a first power amplifier 210, a second power amplifier 220, a power combining network 230, a first matching network 240, a phase compensation 245, a second matching network 247, and an output load $Z_L$. The DPA 200 may be configured in a structure where the first power amplifier 210 and the second power amplifier 220 are coupled. In so doing, powers divided through the power divider 205 may be inputted to the first power amplifier 210 and the second power amplifier 220. In other words, the power divider 205 may divide a signal received from an input end. For example, the power divider 205 may be a Wilkinson power divider.

The first power amplifier 210 may be referred to as a main power amplifier (PA), a main amplifier, or a carrier PA. The second power amplifier 220 may be referred to as an auxiliary PA, an auxiliary amplifier, or a peaking PA. For example, the first power amplifier 210 may be configured with a class-AB biased power amplifier, and the second power amplifier 220 may be configured with a class-C biased power amplifier.

An output end of the first power amplifier 210 may be coupled with the first matching network 240. The first matching network 240 may indicate a configuration for load modulation. The first matching network 240 may be a transmission line. For example, the transmission line may be $R_{opt}$ in characteristic impedance, and 90° in electrical length. In addition, to compensate for a phase change of the signal outputted from the first power amplifier 210, by the first matching network 240, an input end of the second power amplifier 220 may be coupled with the phase compensation 245. The phase compensation 245 may indicate a configuration for shifting a phase of the signal. The phase compensation 245 may indicate a transmission line. For example, the transmission line may be 90° in electrical length. In addition, the second matching network 247 may be coupled to an output end of the second power amplifier 220. The second matching network 247 may indicate a transmission line. The second matching network 247 may be the transmission line for delivering a signal without changing signal characteristics. Provided that an electrical path connected to the output end of the first power amplifier 210 is a first path, and an electrical path connected to the output end of the second power amplifier 220 is a second path, the power combining network 230 may connect the first path and the second path, and an output end of the Doherty power amplifier 200. The connection of the power combining network 230 between the first path and the second path, and the output end of the Doherty power amplifier 200 may indicate an electrical connection, which may indicate either a direct connection or an indirect connection. Specific examples of the coupling of the power combining network 230 shall be described in FIG. 2B.

Figure 2B:
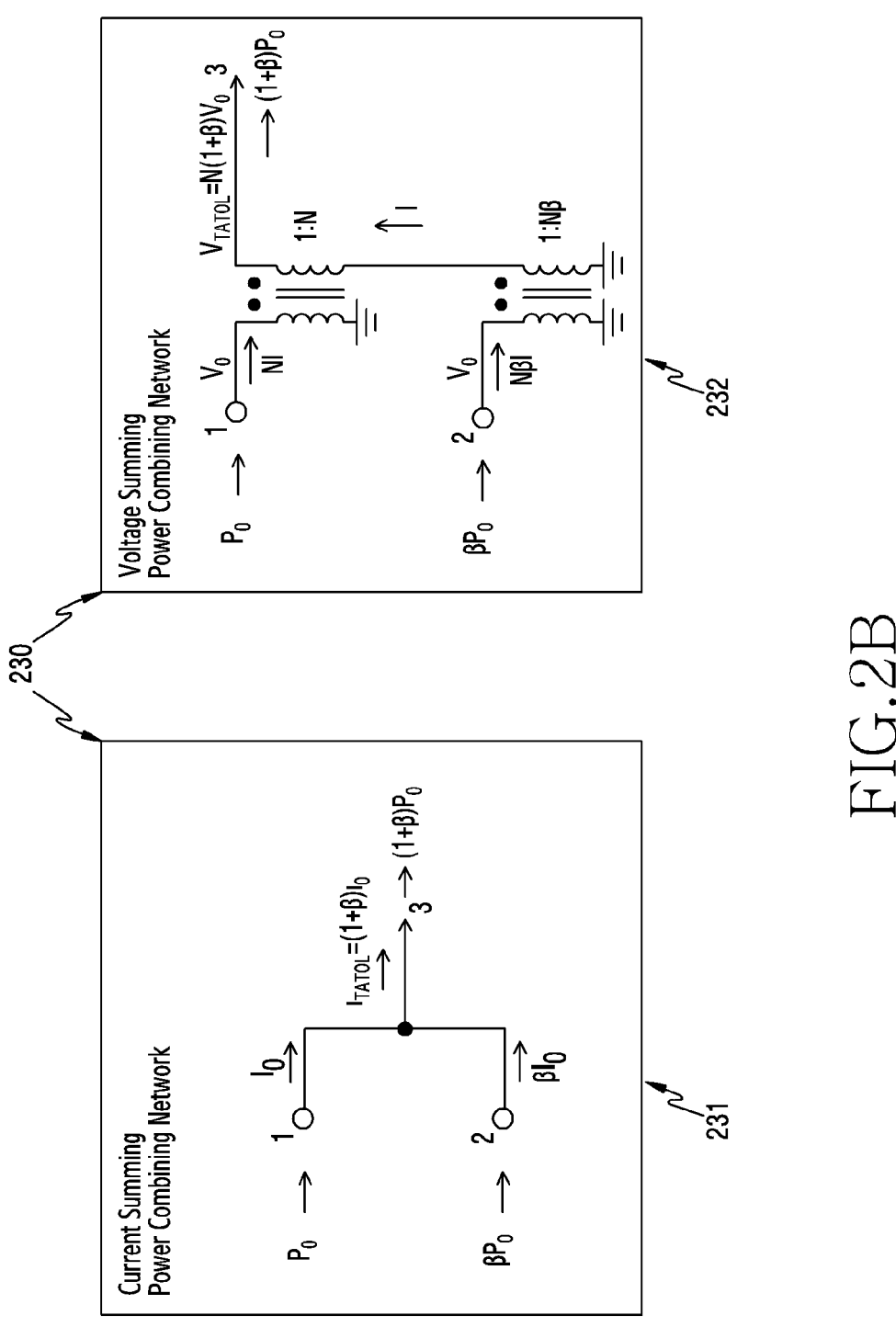
FIG. 2B illustrates an example of a power combining network for describing according to an embodiment of the disclosure.

FIG. 2B illustrates an example of the power combining network for describing according to an embodiment of the disclosure. The power combining network may indicate the power combining network 230 of FIG. 2A. In other words, the power combining network may indicate a structure for electrically connecting a first path connected to an output end of a main power amplifier of the Doherty power amplifier and a second path connected to an output end of an auxiliary power amplifier, and the output end of the Doherty power amplifier. To ease the explanation, a point connected with the first path in the power combining network is referred to as a first end or port, a point connected with the second path is referred to as a second end or port, and a point connected with the output end of the Doherty power amplifier is referred to as a third end or port.

Referring to FIG. 2B, the power combining network 230 may include a power combining network 231 according to current summing, and a power combining network 232 according to voltage summing. The power combining network 230 may combine a plurality of inputted power and output a single power. For example, considering the Doherty power amplifier of FIG. 2A, an output power of the first power amplifier 210 and an output power of the second power amplifier 220 may be combined and outputted as one power.

The power combining network 231 according to current summing may combine the first end, the second end and the third end at one node, and be configured to apply the same voltage V. For example, provided that a current inputted through the first end in the first path is $I_0$, and a current inputted through the second end in the second path is $BI_0$, a current outputted through the third end may be $(1+B)I_0$. In addition, provided that effective power of the first end is $P_0$, and effective power of the second end is $\beta P_0$, effective power of the third end may be $(1+\beta)P_0$. The parameter $\beta$ denotes a ratio to a reference. In the above example, provided that impedance terminated at the third end is $Z_L$, input impedance of the first end may be $(\beta+1)Z_L$, and input impedance of the second end may be $(\beta+1)\beta^{-1}Z_L$.

The power combining network 232 according to the voltage summing may electrically connect the first end, the second end and the third end through a plurality of transformers. FIG. 2B describes the power combining network 232 including ideal transformers by way of example for the sake of explanation. Provided that a current outputted through the third end is I, a turns ratio of each of the transformers may be determined to make the current inputted through the first end in the first path NI, and the current inputted through the second end in the second path NBI. For example, provided that the transformer between the first end and the third end is a first transformer, and the transformer between the second end and the third end is a second transformer, the turns ratio of the first transformer may be 1:N, and the turns ratio of the second transformer may be 1:Nβ. In addition, if the voltage of the first end and the voltage of the second end are set to the same voltage $V_0$, the voltage of the third end may be $N(1+\beta)V_0$. Hence, provided that effective power of the first end is $P_0$, and effective power of the second end is $\beta P_0$, effective power of the third end may be $(1+\beta)P_0$. $\beta$ denotes the ratio to the reference. In the above example, assuming that the impedance terminated at the third end is $Z_L$, the input impedance of the first end may be $N^{-2}(\beta+1)^{-1}Z_L$, and the input impedance of the second end may be $N^{-2}(\beta+1)^{-1}\beta Z_L$.

As described above, the power amplifiers (e.g., the main power amplifier, the auxiliary power amplifier) of the Doherty power amplifier and the output end of the Doherty power amplifier may be connected through the power combining network 230. Hence, the power amplifiers (e.g., the main power amplifier, the auxiliary power amplifier) of the Doherty power amplifier and the output end of the Doherty power amplifier may be directly connected through the power combining network 231 according to the current summing, and may be indirectly connected through the power combining network 232 according to the voltage summing. In other words, the connection through the power combining network 230 may indicate the electrical connection. The power combining network 230 may output the plurality of the inputted powers as one power.

Figure 2C:
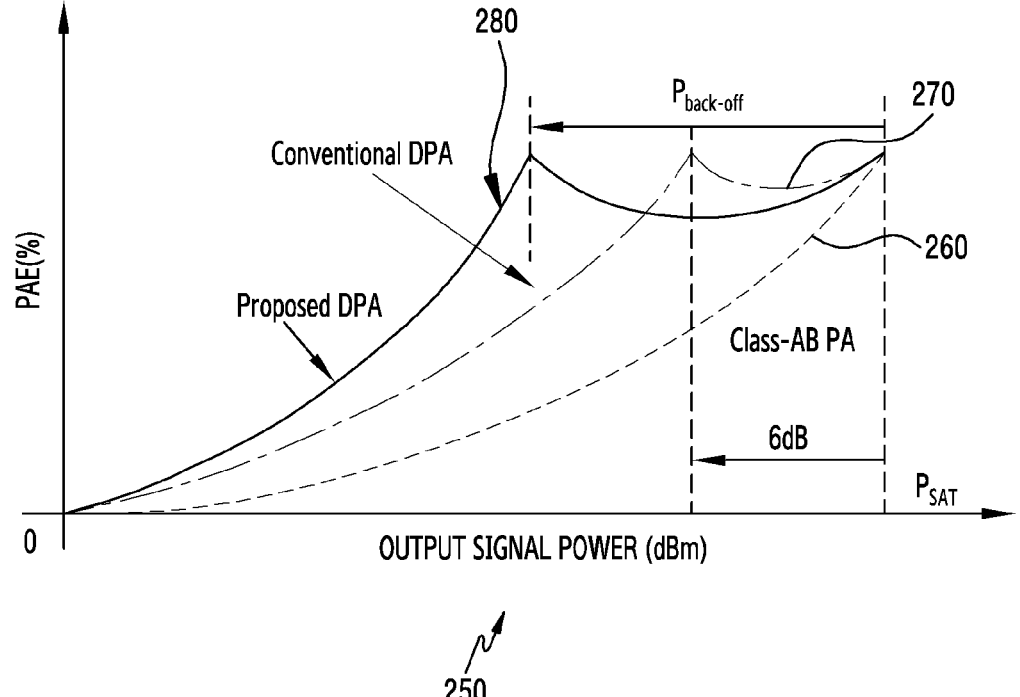
FIG. 2C is a graph illustrating examples of power added efficiency (PAE) of power amplifiers based on an output signal according to an embodiment of the disclosure.

FIG. 2C is a graph illustrating examples of power added efficiency (PAE) of power amplifiers based on an output signal according to an embodiment of the disclosure. The PAE is a different concept from the power efficiency, and may indicate power efficiency considering only the power generated at the power amplifier. For example, if DC input power is 15 mW, power supplied to the power amplifier is 1 mW, and power outputted from the power amplifier is 10 mW, the PAE may be calculated as 100*(10 mW−1 mW)/15 mW=60%. For example, the power may indicate RF power.

Referring to FIG. 2C, a graph 250 shows a first line 260 showing the PAE based on the power of the output signal of the class-AB power amplifier, a second line 270 showing the PAE based on the power of the output signal of the DPA, and a third line 280 showing the PAE based on the power of the output signal of the DPA using the common mode of the disclosure. A horizontal axis of the graph 250 may indicate the power (unit: dBm) of the output signal, and a vertical axis may indicate the PAE (unit: %).

Referring to the first line 260, the first line 260 may have a maximum PAE value at power $P_{SAT}$ saturated at a maximum output of the outputted signal. However, it is required to back off by a specific value in consideration of the PAPR to achieve linearity of the power amplifier, as described above. However, the PAE is significantly reduced in the region backed off from $P_{SAT}$ by about 6 dB.

Referring to the second line 270, the second line 270 may have the maximum PAE value at $P_{SAT}$, in the same manner as the first line 260. The second line 270 has a similar value to the PAE at $P_{SAT}$ even in the region backed off about 6 dB, unlike the first line 260, and the efficiency may be generated high. However, in the back-off region over about 6 dB, the PAE of the second line 270 noticeably decreases. For example, in the back-off region of about 9 dB, the PAE of the second line 270 may be formed lower than the PAE of 6 dB. That is, the modulation signal using a high-order modulation scheme may be increased in the PAPR, and a conventional Doherty power amplifier (e.g., the Doherty power amplifier 200 of FIG. 2A) may linearly amplify a signal having a high PAPR (over 6 dB) and limit the capability of improving the amplifier efficiency.

Referring to the third line 280, the third line 280 may have the maximum PAE value at $P_{SAT}$, in the same manner as the first line 260. In addition, high efficiency having the same value as the PAE at $P_{SAT}$ even in the back-off region over about 6 dB may be generated. Hence, with respect to the signal having the high PAPR according to using the high-order modulation scheme, the Doherty power amplifier (e.g., the Doherty power amplifier 300 of FIG. 3) using the impedance modulation of the disclosure may provide high efficiency in the back-off region (over about 6 dB) retaining the linearity.

In other words, as a communication system such as 5G or pre-5G is developed, the wireless communication system may adopt the modulation schemes for providing greater data capacity. Such modulation schemes may require high PAPR. However, the Doherty power amplifier 200 of FIG. 2A improves the efficiency only in the back-off region of about 6 dB, compared to the class-AB bias power amplifier, and may be limited in the efficiency improving capability with respect to the modulation signals having high PAPR. To address this problem, the disclosure suggests a Doherty power amplifier (hereafter, a Doherty power amplifier using a common mode) for adjusting the back-off region to provide an improved efficiency, by using a common mode through a configuration which interconnects power amplifiers of the Doherty power amplifier.

Figure 3:
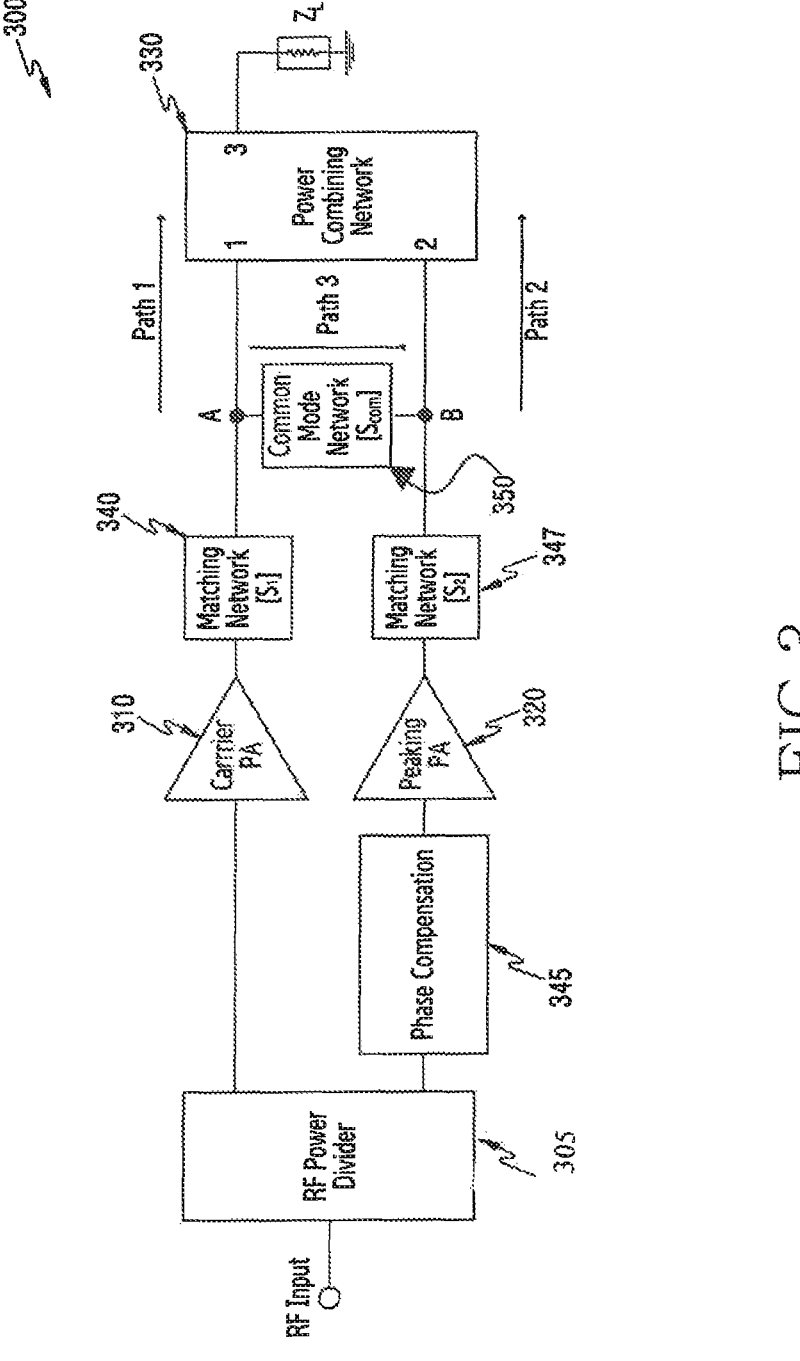
FIG. 3 illustrates an example of a Doherty power amplifier using a common mode according to an embodiment of the disclosure.

FIG. 3 illustrates an example of a Doherty power amplifier using a common mode according to an embodiment of the disclosure.

Referring to FIG. 3, a Doherty power amplifier 300 may include a power divider or an RF power divider 305, a first power amplifier 310, a second power amplifier 320, a power combining network 330, a first matching network 340, a phase compensation 345, a second matching network 347, and a common mode network 350. The first power amplifier 310 may be referred to as a main PA, a main amplifier or a carrier PA. In addition, the second power amplifier 320 may be referred to as an auxiliary PA, an auxiliary amplifier, or a peaking PA.

According to an embodiment, the first power amplifier 310 may amplify power with respect to a signal (e.g., an RF signal) divided and inputted from the power divider 305. The first power amplifier 310 may provide the amplified output signal to the power combining network 330 via the first matching network 340. Provided that an arbitrary point at one end close to the power combining network 330 among both ends of the first matching network 340 is a node A, a path connecting the node A and a first end or port of the power combining network 330 may be referred to as a first path. The second power amplifier 320 may receive a signal which is divided and inputted from the power divider 305 and compensated in phase through the phase compensation 345. The second power amplifier 320 may amplify power of the inputted signal and provide it to the power combining network 330 via the second matching network 347. Provided that an arbitrary point at one end close to the power combining network 330 among both ends of the second matching network 347 is a node B, a path connecting the node B and a second end or port of the power combining network 330 may be referred to as a second path. According to an embodiment, the first power amplifier 310 may be configured with a class-AB power amplifier. The second power amplifier 320 may be configured with a class-C power amplifier.

According to an embodiment, the power combining network 330 may indicate a structure for interconnecting a first end, a second end and a third end. The first end may be connected to the first path which is extended from the first power amplifier 310 and interconnects the first matching network 340 and the node A. The second end may be connected to the second path which is extended from the second power amplifier 320 and interconnects the second matching network 347 and the node B. The third end may indicate an output end of the Doherty power amplifier 300, and the output end of the Doherty power amplifier 300 may be connected with load having impedance $Z_L$. The power combining network 330 may include a power combining network using current summing and a power combining network using voltage summing, as explained in FIG. 2B. Details thereof shall be described in FIGS. 5A and 5B.

According to an embodiment, the first matching network 340 may indicate a configuration for load modulation. For example, the first matching network 340 may be a transmission line. The first matching network 340 may be referred to as a first transmission line. For the load modulation, the first matching network 340 may be configured with characteristics of a specific condition.

According to an embodiment, the phase compensation 345 may indicate a configuration for compensating for a phase difference between the first power amplifier 310 and the second power amplifier 320. For example, the phase compensation 345 may be a transmission line. The phase compensation 345 may be referred to as a second transmission line.

According to an embodiment, the second matching network 347 may indicate a configuration for the load modulation. For example, the second matching network 347 may be a transmission line. However, it may be the transmission line for delivering the signal without changing characteristics of the signal outputted from the second power amplifier 320, to ease explanation in the disclosure. Thus, the second matching network 347 may not be depicted. However, the disclosure is not limited thereto, and the second matching network 347 may be configured with characteristics of a specific condition for the sake of more precise impedance matching.

According to an embodiment, the common mode network 350 may be an arbitrary reactance element. For example, the common mode network 350 may be the element having an impedance value of jX. The parameter j may denote an imaginary unit, and X may denote a random constant. The common mode network 350 may be a capacitor or an inductor which is a lumped element as described in FIG. 4B, and may be a transmission line which is a distributed element substantially operating as the capacitor or the inductor in a high frequency signal. In addition, the common mode network 350 may include a combination of the lumped element and the distributed element. Descriptions on the common mode characteristic and the structure of the common mode network 350 shall be elucidated in FIGS. 4A and 4B.

According to an embodiment, the common mode network 350 may be disposed between the node A and the node B. For example, provided that a path interconnecting the node A and the node B is a third path, the common mode network 350 may be disposed on the third path. The common mode network 350 may electrically separate the first path and the second path under a specific conditioner through the common mode characteristic, to be described. In other words, the common mode network 350 may build an electrical wall to electrically open the third path. Details thereof shall be explained in FIG. 4A.

Figure 4A:
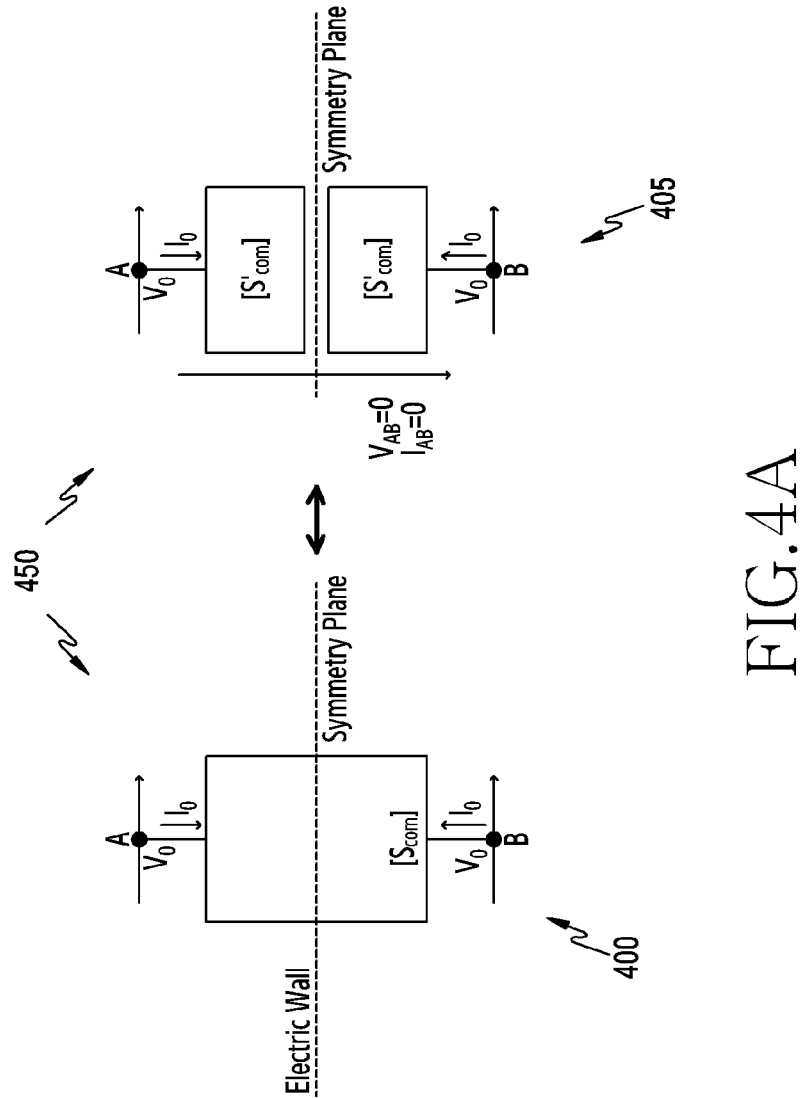
FIG. 4A illustrates an example for describing a common mode characteristic of a common mode network according to an embodiment of the disclosure.

FIG. 4A illustrates an example for describing a common mode characteristic of a common mode network according to an embodiment of the disclosure. A common mode network 450 of FIG. 4A may be understood in the same manner as the common mode network 350 of FIG. 3. FIG. 4A depicts connections between the common mode network 450 and adjacent nodes (e.g., a node A and a node B), and other connections are omitted to ease description.

Referring to FIG. 4A, the common mode network 450 is depicted in a diagram 400 and a diagram 405 disposed between the node A and the node B. The diagram 400 and the diagram 405 may be electrically identical equivalent circuits. To explain the common mode characteristic of the common mode network 450, it is assumed that an S parameter of the common mode network 450 is $S_{COM}$, voltage of the node A is $V_0$, voltage of the node B is $V_0$, current flowing from the node A to the common mode network 450 is $I_0$, and current flowing from the node B to the common mode network 450 is $I_0$.

An arbitrary circuit (e.g., the common mode network 450) may build an electrical wall which blocks current in a symmetric plane between two symmetric nodes. Along the built electrical wall, the common mode network 450 may be divided into two configurations having S parameter of $S_{COM}'$. In other words, the common mode network 450 may be configured in the symmetric structure between the node A and the node B. According to the definition of the voltage, potential difference may not be generated, and $V_{AB}$=0. In addition, the current flowing in the opposite directions is cancelled, and accordingly $I_{AB}$=0. That is, the current component flowing from the node A toward the node B or from the node B toward the node A may be 0.

As described above, in the network (e.g., the common mode network 450) connecting two different nodes, if the potential is identical and the magnitude of the current is identical but the phases are opposite (i.e., current of opposite directions) at two nodes, the electrical wall may be built and divided into two identical networks. A structure of a Doherty power amplifier for improving efficiency in a wider back-off region, by dividing into different paths based on such characteristics, is described, in FIGS. 5A, 5B, 6A, 6B, 7A, 7B, 8A, 8B, 8C, and 9.

Figure 4B:
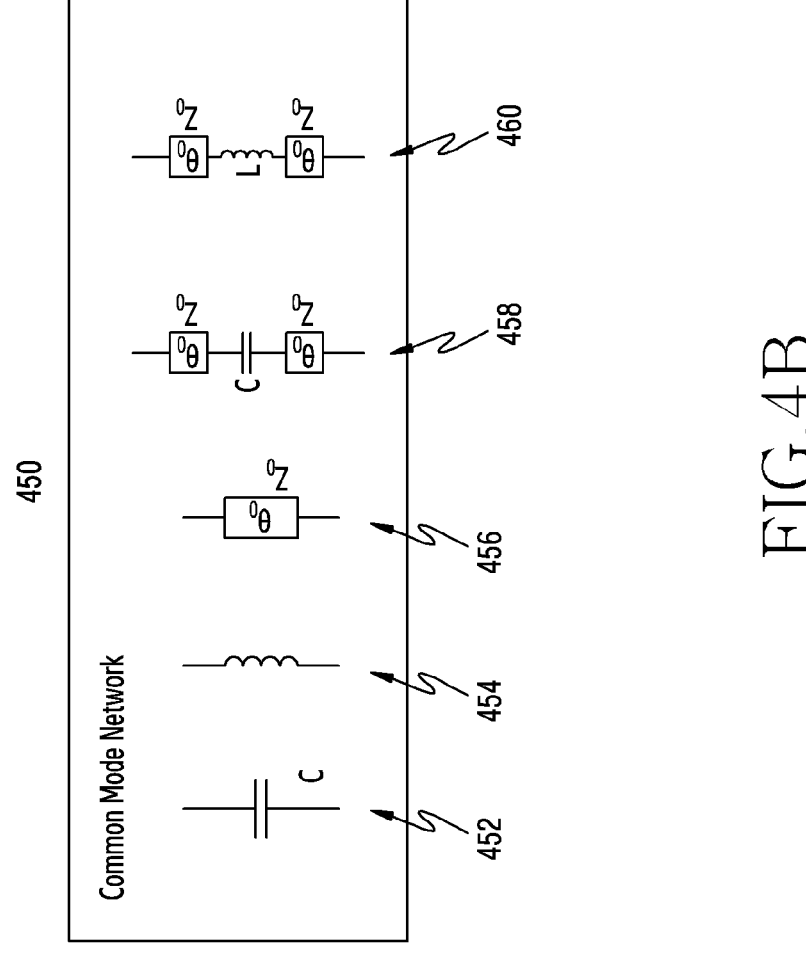
FIG. 4B illustrates examples of a structure of a common mode network according to an embodiment of the disclosure.

FIG. 4B illustrates examples of the structure of the common mode network according to an embodiment of the disclosure. FIG. 4B illustrates various examples for configuring the common mode network 450. However, the common mode network of the Doherty power amplifier using the common monde according to embodiments of the disclosure is not interpreted only in the structures shown in FIG. 4B. That is, a configuration having the electrically same meaning may be understood as an embodiment of the disclosure.

Referring to FIG. 4B, the common mode network 450 may include a lumped element. For example, the common mode network 450 may include a capacitor 452 with capacitance C. As another example, the common mode network 450 may include an inductor 454 with inductance L. Also, the common mode network 450 may include a combination of a capacitor and an inductor, which is not depicted.

In addition, the common mode network 450 may include a distributed element. For example, the common mode network 450 may include a transmission line 456. The transmission line may be configured with the characteristic impedance of $Z_0$ and the electrical length of 0°.

In addition, the common mode network 450 may include a combination of a lumped element and a distributed element. For example, the common mode network 450 may include a combination 458 of a capacitor and transmission lines. In addition, the common mode network 450 may include a combination 460 of an inductor and transmission lines.

The common mode network 450 may include at least one of a lumped element or a distributed element, as shown in FIG. 4B. In other words, the common mode network 450 may be configured, through a combination of at least one capacitor, at least one inductor, or at least one transmission line.

FIG. 5A illustrates an example of coupling between output ends of power amplifiers of a Doherty power amplifier using a common mode according to an embodiment of the disclosure. The Doherty power amplifier of FIG. 5A includes a power combining network according to current summing. In other words, FIG. 5A illustrates the example of the Doherty power amplifier including the power combining network 231 of FIG. 2B. The power combining network according to the current summing is referred to as a first power combining network.

Referring to FIG. 5A, a Doherty power amplifier 500 may include a power divider or RF power divider 505, a first power amplifier 510, a second power amplifier 520, a first power combining network 530, a first matching network 540, a phase compensation 545, and a common mode network 550. The first power amplifier 510 may be referred to as a main PA, a main amplifier or a carrier PA. In addition, the second power amplifier 520 may be referred to as an auxiliary PA, an auxiliary amplifier or a peaking PA.

According to an embodiment, the first power amplifier 510 may amplify power with respect to a signal (e.g., an RF signal) divided and inputted from the power divider 505. The first power amplifier 510 may provide the amplified output signal to the first power combining network 530 via the first matching network 540. Provided that an arbitrary point at one end close to the first power combining network 530 among both ends of the first matching network 540 is a node A, a path connecting the node A and a first end or port of the first power combining network 530 may be referred to as a first path. The second power amplifier 520 may receive a signal which is divided and inputted from the power divider 505 and compensated in phase through the phase compensation 545. The second power amplifier 520 may amplify power of the inputted signal and provide it to the first power combining network 530. Provided that an arbitrary point between the output end of the second power amplifier 520 and the first power combining network 530 is a node B, a path connecting the node B and a second end or port of the first power combining network 530 may be referred to as a second path. According to an embodiment, the first power amplifier 510 may be configured with a class-AB power amplifier. The second power amplifier 520 may be configured with a class-C power amplifier.

According to another embodiment, the first power combining network 530 may include a combining circuit 531 and a first impedance matching circuit 533 and a second impedance matching circuit 535. The combining circuit 531 may indicate a structure for interconnecting a first end, a second end and a third end at one node. The first end may be connected to the first path which is extended from the first power amplifier 510 and interconnects the first matching network 540, the node A and the first impedance matching circuit 533. The second end may be connected to the second path, which is extended from the second power amplifier 520 and interconnects the node B and the second impedance matching circuit 535. The third end may indicate an output end of the Doherty power amplifier 500, and the output end of the Doherty power amplifier 500 may be connected with load of impedance $R_L$. At this time, the first impedance matching circuit 533 and the second impedance matching circuit 535 may indicate a transmission line for making voltage $V_A$ of the node A and voltage VB of the node B the same. FIG. 5A illustrates, to ease the explanation, the first impedance matching circuit 533 as the transmission line having characteristic impedance of $Z_C$ and the electrical length of 90°, and the second impedance matching circuit 535 as the transmission line having characteristic impedance of $Z_P$ and the electrical length of 90°. As described above, the first power combining network 530 which is the current summing power combining network may include a combining network 531 for connecting the first end and the second end connected with the power amplifiers with the output end. In addition, the first power combining network 530 may include the first impedance matching circuit 533 and the second impedance matching circuit 535 for making the potential difference of nodes (e.g., the node A and the node B) between the paths (e.g., the first path, the second path) extended from the output end of the power amplifiers zero.

According to another embodiment, the first matching network 540 may indicate a configuration for the load modulation. For example, the first matching network 540 may be a transmission line. The first matching network 540 may be referred to as a first transmission line. For the load modulation, the first matching network 540 may be configured with characteristics of a specific condition. For example, the first matching network 540 may be a transmission line having the characteristic impedance $R_{opt}$, and the electrical length $\theta_{offset}$°.

According to another embodiment, the phase compensation 545 may indicate a configuration for compensating for a phase difference between the first power amplifier 510 and the second power amplifier 520. The phase difference between the first power amplifier 510 and the second power amplifier 520 may indicate a phase difference occurred according to the first matching network 504. The phase compensation 545 may be a transmission line. The phase compensation 545 may be referred to as a second transmission line. For example, the phase compensation 545 may be the transmission line of the electrical length $\theta_{offset}$° to compensate for the phase difference.

According to another embodiment, the common mode network 550 may be an arbitrary reactance element. For example, the common mode network 550 may be the element having an impedance value of jX. The parameter j may denote an imaginary unit, and X may denote a random constant. The common mode network 550 may be a capacitor or an inductor which is a lumped element, and may be a transmission line which is a distributed element substantially operating as the capacitor or the inductor in a high frequency signal. In addition, the common mode network 550 may include a combination of a lumped element and a distributed element.

According to another embodiment, the common mode network 550 may be disposed between the node A and the node B. For example, provided that a path interconnecting the node A and the node B is a third path, the common mode network 550 may be disposed on the third path. The common mode network 550 may electrically separate the first path and the second path under a specific condition through the common mode characteristic. The specific condition may indicate that the potential of the node A and the node B is identical, the magnitude of the current is identical, but the phases are opposite (i.e., current of opposite directions). In other words, the common mode network 550 may build an electrical wall to electrically open the third path.

FIG. 5B illustrates another example of coupling between the output ends of the power amplifiers of the Doherty power amplifier using the common mode according to an embodiment of the disclosure. The Doherty power amplifier of FIG. 5B includes a power combining network according to voltage summing. In other words, FIG. 5B illustrates the example of the Doherty power amplifier including the power combining network 232 of FIG. 2B. Hereafter, the power combining network according to the voltage summing is referred to as a second power combining network.

Referring to FIG. 5B, the Doherty power amplifier 500 may include the power divider or RF power divider, the first power amplifier 510, the second power amplifier 520, a second power combining network 532, the first matching network 540, the phase compensation 545, and the common mode network 550. The first power amplifier 510 may be referred to as the main PA, the main amplifier or the carrier PA. In addition, the second power amplifier 520 may be referred to as the auxiliary PA, the auxiliary amplifier or the peaking PA.

According to an embodiment, the first power amplifier 510 may amplify power with respect to a signal (e.g., an RF signal) divided and inputted from the power divider 505. The first power amplifier 510 may provide the amplified output signal to the second power combining network 532 via the first matching network 540. Provided that an arbitrary point at one end close to the second power combining network 532 among both ends of the first matching network 540 is a node A, a path connecting the node A and a first end or port of the second power combining network 532 may be referred to as a first path. The second power amplifier 520 may receive a signal which is divided and inputted from the power divider 505 and compensated in phase through the phase compensation 545. The second power amplifier 520 may amplify power of the inputted signal and provide it to the second power combining network 532. Provided that an arbitrary point between the output end of the second power amplifier 520 and the second power combining network 532 is a node B, a path connecting the node B and a second end or port of the second power combining network 532 may be referred to as a second path. According to an embodiment, the first power amplifier 510 may be configured with a class-AB power amplifier. The second power amplifier 520 may be configured with a class-C power amplifier.

According to another embodiment, the second power combining network 532 may include a plurality of transformers. The second power combining network 532 may include a first transformer interconnecting a first end and a third end and a second transformer interconnecting a second end and the third end. The first end may be connected to the first path which is extended from the first power amplifier 510 and interconnects the first matching network 540 and the node A. The second end may be connected to the second path which is extended from the second power amplifier 520 and connects the node B. The third end may indicate the output end of the Doherty power amplifier 500, and the output end of the Doherty power amplifier 500 may be connected with output the impedance $R_L$. According to another embodiment, the plurality of the transformers of the second power combining network 532 may be configured with a turns ratio for making the voltage $V_A$ of the node A and voltage VB of the node B the same. In other words, the turns ratio of the first transformer and the turns ratio of the second transformer distinguished based on a node 534 may be different from each other. As described above, the second power combining network 532 which is the voltage summing power combining network may not include the first impedance matching circuit 533 and the second impedance matching circuit 535 unlike the first power combining network 530. This is because the second power combining network 532 may design the potential difference 0 of the node A and the node B based on the turns ratios of the first transformer and the second transformer. According to another embodiment, the transformers of the second power combining network 532 may be configured with transmission lines. That is, the transformers may be configured according to electromagnetic induction of adjacent transmission lines. For example, the transmission line may be twisted (i.e., spiral) to form the transformer, and the turns ratio may differ depending on the twist degree.

According to another embodiment, the first matching network 540 may indicate the configuration for the load modulation. For example, the first matching network 540 may be a transmission line. The first matching network 540 may be referred to as a first transmission line. For the load modulation, the first matching network 340 may be configured with characteristics of a specific condition. For example, the first matching network 540 may be the transmission line having the characteristic impedance $R_{opt}$, and the electrical length $\theta_{offset}°$.

According to another embodiment, the phase compensation 545 may indicate the configuration for compensating for a phase difference between the first power amplifier 510 and the second power amplifier 520. The phase difference between the first power amplifier 510 and the second power amplifier 520 may indicate a phase difference occurred according to the first matching network 540. The phase compensation 545 may be a transmission line. The phase compensation 545 may be referred to as a second transmission line. For example, the phase compensation 545 may be the transmission line of the electrical length $\theta_{offset}°$ to compensate for the phase difference.

According to another embodiment, the common mode network 550 may be an arbitrary reactance element. For example, the common mode network 550 may be the element having the impedance value of jX. The parameter j may denote the imaginary unit, and X may denote the random constant. The common mode network 550 may be a capacitor or an inductor which is the lumped element, and may be a transmission line which is the distributed element substantially operating as the capacitor or the inductor in the high frequency signal. In addition, the common mode network 550 may include a combination of a lumped element and a distributed element.

According to another embodiment, the common mode network 550 may be disposed between the node A and the node B. For example, provided that a path interconnecting the node A and the node B is a third path, the common mode network 550 may be disposed on the third path. The common mode network 550 may electrically separate the first path and the second path under a specific condition through the common mode characteristic. The specific condition may indicate that the potential of the node A and the node B is identical, the magnitude of the current is identical, but the phases are opposite (i.e., current of opposite directions). In other words, the common mode network 550 may build an electrical wall to electrically open the third path.

FIG. 6A illustrates an example of operations of a Doherty power amplifier using a common mode in a first state according to an embodiment of the disclosure.

FIG. 6B illustrates an example of operations of the Doherty power amplifier using the common mode in a second state according to an embodiment of the disclosure.

A Doherty power amplifier 600 of FIG. 6A and a Doherty power amplifier 605 of FIG. 6B may be understood in the same manner as the Doherty power amplifier 500 of FIG. 5A. Thus, details on structures of the Doherty power amplifier 600 and the Doherty power amplifier 605 may be understood in the same manner as the Doherty power amplifier 500 of FIG. 5A. An operation process of the Doherty power amplifier 600 of the first state and the Doherty power amplifier 605 of the second state shall be described, and the same description as the description in FIG. 5A is omitted. The first state may indicate a high power (HP) state, and the second state may indicate a low power (LP) state. The HP and the LP may be determined relatively based on maximum output power. For example, the HP (i.e., the first state) may indicate the maximum output power. In addition, the LP (i.e., the second state) may indicate a power region lower than the maximum output power and with no power output from the auxiliary amplifier.

Referring to FIG. 6A, the Doherty power amplifier 600 may include a power divider or RF power divider 601, a first power amplifier 610, a second power amplifier 620, a first power combining network 630, a first matching network 640 (i.e., a first transmission line), a phase compensation 645 (i.e., a second transmission line) and a common mode network 650.

According to an embodiment, in the first state (i.e., the HP state), an output power magnitude ratio of the first power amplifier 610 of the Doherty power amplifier 600 and the second power amplifier 620 of the Doherty power amplifier 600 may be defined as 1:B. The parameter β may indicate a ratio of the power to reference power (e.g., the output power of the first power amplifier). For example, in a symmetric Doherty power amplifier, β may be 1. In addition, for example, in an asymmetric Doherty power amplifier, B may be a value smaller than 1 or greater than 1. If the first power amplifier 610 and the second power amplifier 620 are $P_0$ and $\beta P_0$ respectively, optimal load impedance of the first power amplifier 610 and the second power amplifier 620 may be determined to $R_{opt}$ and $R_{opt}/B$ in the first state. For the optimal load impedance, the first matching network 640 may be a transmission line having the characteristic impedance $R_{opt}$, and the electrical length $\theta_{offset}°$. In addition, the phase compensation 645 may be a transmission line in the electrical length $\theta_{offset}°$, to compensate for a phase difference occurred by the first matching network 640.

According to another embodiment, for a condition (i.e., a potential difference between a node A and a node B is 0) for separating a first path formed by extending from an output end of the first power amplifier 610 and a second path formed by extending from an output end of the second power amplifier 620, a relationship between a first impedance matching circuit 633 and a second impedance matching circuit 635 is given by the following Equation 1.

$$Z_C = \beta Z_P = \sqrt{(1+B)R_L R_{opt}} \qquad \text{Equation 1}$$

$Z_C$ may denote characteristic impedance of the first impedance matching circuit 633, $Z_P$ may denote characteristic impedance of the second impedance matching circuit 635, β may denote an output power ratio of the first power amplifier 610 and the second power amplifier 620 in the first state, $R_L$ may denote load impedance connected to the output end of the Doherty power amplifier 600, and $R_{opt}$ may denote optimal load impedance of the first power amplifier 610 in the first state. $R_L$ and $R_{opt}$ are assumed to be the impedance including only resistance component to ease calculation.

According to the above equation, if the first impedance matching circuit 633 and the second impedance matching circuit 635 satisfy the impedance ratio relationship of β:1, the potential difference $V_{AB}$ between the node A and the node B may be 0, and the current $I_{AB}$ between the node A and the node B may be 0. In this case, the common mode network 650 may build an electrical wall. Since the common mode network 650 operates as the configuration which does not electrically exist, the output end of the first power amplifier 610 and the output end of the second power amplifier 620 (i.e., the first path and the second path) may be separated. As a result, the optimal load impedance $R_{opt}$ may be applied to the output end of the first power amplifier 610, and the optimal load impedance $\beta^{-1}R_{opt}$ may be applied also to the output end of the second power amplifier 620. The Doherty power amplifier 600 may output optimal power in the first state.

According to another embodiment, in the second state (i.e., the LP state), the second power amplifier 620 of the Doherty power amplifier 600 may be controlled not to operate. If the second power amplifier 620 does not operate, the impedance from a perspective of the output end of the second power amplifier 620 may be infinite co. In the second state, the output power of the first power amplifier 610 may be reduced to $k^{-1}P_0$. In this case, impedance $Z_c'$ viewed as the load at the node A may be given by the following equation.

$$Z_C' = (\beta + 1)^{-1} R_{opt} + j\beta^2(\beta + 1)^{-2} X \qquad \text{Equation 2}$$

$Z_C'$ may denote impedance viewed as the load at the node A in the second state, β may denote the power ratio of the first power amplifier 610 and the second power amplifier 620, j may denote the imaginary unit, X may denote reactance of the common mode network 650, and $R_{opt}$ may denote the optimal load impedance of the first power amplifier 610 in the first state.

$Z_C'$ may be calculated according to an equivalent circuit (or port network system analysis) viewing the node A.

If the output power of the first power amplifier 610 is reduced by a multiple of $k^{-1}$, the optimal load impedance of the output end of the first power amplifier 610 may be determined to a value $kR_{opt}$ increased (i.e., modulated) by k times. The first matching network 640 may satisfy an impedance transformation relationship based on the following equation to provide the optimal load impedance for the output end of the first power amplifier 610.

$$(Z_C')* = R_{opt}\frac{1 + jk\tan(\theta_{offset}^\circ)}{k + j\tan(\theta_{offset}^\circ)} \qquad \text{Equation 3}$$

$Z_C'$ may denote a complex conjugate of the impedance viewed as the load at the node A in the second state, j may denote the imaginary unit, k may denote an impedance modulation rate, and $R_{opt}$ may denote the optimal load impedance of the first power amplifier 610 in the first state.

Considering the above equation and a transmission line theory, equations of the reactance component X of the common mode network 650 and the electrical length $\theta_{offset}^\circ$ of the first matching network 640 may be written as the following equations.

$$\tan(\theta_{offset}^\circ) = \frac{\sqrt{(\beta + 1)k - 1}}{\sqrt{k^2 - k(\beta + 1)}} \qquad \text{Equation 4}$$

$$X = R_{opt}\frac{(\beta + 1)(\beta + 1 - k)\tan(\theta_{offset}^\circ)}{\beta^2}$$

$$\theta_{offset}^\circ$$

may demote the electrical length of the first matching network 640, β may denote the output power ratio of the first power amplifier 610 and the second power amplifier 620 in the first state, k may denote the impedance modulation rate, and $R_{opt}$ may denote the optimal load impedance of the first power amplifier 610 in the first state.

Considering the above, if the Doherty power amplifier 600 is in the first state (HP), the first path extended from the output end of the first power amplifier 610 and the second path extended from the output end of the second power amplifier 620 may be electrically separated by the common mode characteristic of the common mode network 650. The optimal load impedance may be applied for the first power amplifier 610 and the second power amplifier 620, by designing the impedance values electrically separated of the first impedance matching circuit 633 and the second impedance matching circuit 635 of the current summing power combining network 630 to meet a specific condition. Hence, the Doherty power amplifier 600 of the first state may output the maximum output power.

In addition, if the Doherty power amplifier 600 is in the second state (LP), the second power amplifier 620 may not operate. To apply the optimal load impedance to the reduced output power of the first power amplifier 610, the first matching network 640 and the common mode network 650 may be determined based on the transmission line theory. At this time, the optimal load impedance for the reduced output power may be modulated at a specific rate (i.e., the modulation rate k), and the back-off region of the Doherty power amplifier 600 for providing the improved efficiency based on the modulation rate may be expanded. In this regard, back-off power $P_{backoff}$ may be given by the following equation with k and β. The back-off power may indicate a difference value between two output power points having maximum efficiency from the maximum output power.

$$P_{backoff}(\text{dB})=10 \log k+10 \log (\beta+1) \qquad \text{Equation 5}$$

$P_{backoff}$ may denote power indicating a back-off range for improving the efficiency of the Doherty power amplifier, β may denote the output power ratio of the first power amplifier 610 and the second power amplifier 620 in the first state, and k may denote a constant indicating the impedance modulation rate. In short, the back-off power $P_{backoff}$ of the Doherty power amplifier may be determined by the modulation rate k of the impedance (i.e., the load impedance) viewed from the output end of the first power amplifier of the Doherty power amplifier, and the power ratio β between the first power amplifier and the second power amplifier. k and β may be determined based on the operation region and the operation state of the power amplifier, in designing the power amplifier.

As above, the Doherty power amplifier using the common mode according to embodiments of the disclosure may output the maximum output power in the first state of the power amplifier, and achieve high efficiency in the wide back-off region in the second state, using the current summing power combining and the common mode characteristic. Hence, the power amplifier of the disclosure may support a signal having a high PAPR required according to a modulation order, and also improve battery efficiency of an electronic device including the power amplifier by minimizing power usage.

FIG. 7A illustrates another example of operations of a Doherty power amplifier using a common mode in a first state according to an embodiment of the disclosure.

FIG. 7B illustrates another example of operations of the Doherty power amplifier using the common mode in a second state according to an embodiment of the disclosure.

A Doherty power amplifier 700 of FIG. 7A and a Doherty power amplifier 705 of FIG. 7B may be understood in the same manner as the Doherty power amplifier 500 of FIG. 5B. Accordingly, details on structures of the Doherty power amplifier 700 and the Doherty power amplifier 705 may be understood in the same manner as the Doherty power amplifier 500 of FIG. 5B. An operation process of the Doherty power amplifier 700 of the first state and the Doherty power amplifier 705 of the second state shall be described, and the same description as the description in FIG. 5A is omitted. The first state may indicate the HP state, and the second state may indicate the LP state. The HP and the LP may be determined relatively based on maximum output power. For example, the HP (i.e., the first state) may indicate a maximum output power region. In addition, the LP (i.e., the second state) may indicate a power region lower than the maximum output power and with no power output from the auxiliary amplifier.

Referring to FIG. 7A, the Doherty power amplifier 700 may include a power divider or RF power divider 701, a first power amplifier 710, a second power amplifier 720, a second power combining network 732, a first matching network 740 (i.e., a first transmission line), a phase compensation 745 (i.e., a second transmission line) and a common mode network 750.

According to an embodiment, in the first state (i.e., the HP state), an output power magnitude ratio of the first power amplifier 710 of the Doherty power amplifier 700 and the second power amplifier 720 of the Doherty power amplifier

700 may be defined as 1:β. β may indicate a ratio of the power against the reference power (e.g., the output power of the first power amplifier 710). For example, in a symmetric Doherty power amplifier, B may be 1. In addition, for example, in an asymmetric Doherty power amplifier, B may be a value smaller than 1 or greater than 1. If the first power amplifier 710 and the second power amplifier 720 are $P_0$ and $\beta P_0$ respectively, optimal load impedance of the first power amplifier 710 and the second power amplifier 720 may be determined to $R_{opt}$ and $R_{opt}/B$ in the first state. For the optimal load impedance, the first matching network 740 may be a transmission line having the characteristic impedance $R_{opt}$, and the electrical length $$\theta_{offset}°.$$

In addition, the phase compensation 745 may be a transmission line in the electrical length $\theta_{offset}°$, to compensate for a phase difference occurred by the first matching network 740.

According to another embodiment, for a condition (i.e., a potential difference between a node A and a node B is 0) for separating a first path formed by extending from an output end of the first power amplifier 710 and a second path formed by extending from an output end of the second power amplifier 720, if a turns ratio of a first transformer between a first end and a third end of the second power combining network 732 is set to 1:N, a turns ratio of a second transformer between a second end and the third end may be set to 1:Nβ. The first transformer and the second transformer may be distinguished based on a node 734. In so doing, considering a relationship between the impedance applied to each end of the impedance transformer as mentioned in FIG. 2B, N is given by the following equation.

$$N = \sqrt{\frac{R_L}{(1+\beta)R_{opt}}} \qquad \text{Equation 6}$$

N may denote the turns ratio of the third end to the first end of the first transformer, β may denote an output power ratio of the first power amplifier 710 and the second power amplifier 720 in the first state, $R_L$ may denote load impedance connected to an output end of the Doherty power amplifier 700, and $R_{opt}$ may denote optimal load impedance of the first power amplifier 710 in the first state. $R_L$ and $R_{opt}$ are assumed to be the impedance including only resistance component to ease the calculation.

According to the above equation, if the first transformer and the second transformer satisfy the turns ratio relationship, the potential difference $V_{AB}$ between the node A and the node B may be 0, and the current $I_{AB}$ between the node A and the node B may be 0. Hence, the common mode network 750 may build an electrical wall. Since the common mode network 750 operates as the configuration which does not electrically exist, the output end of the first power amplifier 710 and the output end of the second power amplifier 720 (i.e., the first path and the second path) may be separated. As a result, the optimal load impedance $R_{opt}$ may be applied to the output end of the first power amplifier 710, and the optimal load impedance $\beta^{-1}R_{opt}$ may be applied also to the output end of the second power amplifier 720. Hence, the Doherty power amplifier 700 may output optimal power in the first state.

According to another embodiment, in the second state (i.e., the LP state), the second power amplifier 720 of the Doherty power amplifier 700 may not to operate. If the second power amplifier 720 does not operate, the impedance viewed from the output end of the second power amplifier 720 may be infinite co. In the second state, the output power of the first power amplifier 710 may be reduced to $k^{-1}P_0$. In this case, impedance $$Z_c`$$

viewed as the load at the node A may be given by the following equation.

$$Z_C` = (\beta + 1)^{-1} R_{opt} + j\beta^2 (\beta + 1)^{-2} X \qquad \text{Equation 7}$$

$$Z_C`$$

may denote the impedance viewed as the load at the node A in the second state, $\beta$ may denote the output power ratio of the first power amplifier 710 and the second power amplifier 720 in the first state, j may denote the imaginary unit, X may denote reactance of the common mode network 750, and $R_{opt}$ may denote the optimal load impedance of the first power amplifier 710 in the first state. $Z_C$ may be calculated according to an equivalent circuit viewing the node A or port network system analysis.

If the output power of the first power amplifier 710 is reduced by a multiple of $k^{-1}$, the optimal load impedance of the output end of the first power amplifier 710 may be determined to a value $kR_{opt}$ increased (i.e., modulated) by k times. Considering the equations and the transmission line theory described in FIGS. 6A and 6B, equations of the reactance component X of the common mode network 750 and the electrical length $\theta_{offset}°$ of the first matching network 740 may be written as the following equations to provide the optimal load impedance for the output end of the first power amplifier 710.

$$\tan(\theta_{offset}°) = \frac{\sqrt{(\beta + 1)k - 1}}{\sqrt{k^2 - k(\beta + 1)}} \qquad \text{Equation 8}$$

$$X = R_{opt} \frac{(\beta + 1)(\beta + 1 - k)\tan(\theta_{offset}°)}{\beta^2}$$

$$\theta_{offset}°$$

may denote the electrical length of the first matching network 740, $\beta$ may denote the output power ratio of the first power amplifier 710 and the second power amplifier 720 in the first state, k may denote the impedance modulation rate, and $R_{opt}$ may denote the optimal load impedance of the first power amplifier 710 in the first state.

Considering the above, if the Doherty power amplifier 700 is in the first state (HP), the first path extended from the output end of the first power amplifier 710 and the second path extended from the output end of the second power amplifier 720 may be electrically separated by the common mode characteristic of the common mode network 750. The optimal load impedance may be applied for the first power amplifier 710 and the second power amplifier 720, by designing the first transformer and the second transformer electrically separated of the current summing power combining network 732 to meet a specific condition. Hence, the Doherty power amplifier 700 of the first state may output the maximum output power.

In addition, if the Doherty power amplifier 700 is in the second state (LP), the second power amplifier 720 may not operate. To apply the optimal load impedance to the reduced output power of the first power amplifier 710, the first matching network 740 and the common mode network 750 may be determined based on the transmission line theory. At this time, the optimal load impedance for the reduced output power may be modulated at a specific ratio (i.e., the modulation rate k), and the back-off region of the Doherty power amplifier 700 for providing the improved efficiency based on the modulation rate may be expanded. In this regard, back-off power $P_{backoff}$ may be given by the following equation with k and $\beta$. The back-off power may indicate a difference value between two output power points having maximum efficiency from the maximum output power.

As above, the Doherty power amplifier using the common mode according to embodiments of the disclosure may output the maximum output power in the first state of the power amplifier, and achieve high efficiency in the wide back-off region in the second state, using the voltage summing power combining and the common mode characteristic. Hence, the power amplifier of the disclosure may support a signal having a high PAPR required according to the modulation order, and also improve battery efficiency of an electronic device including the power amplifier by minimizing power usage.

FIG. 8A is a graph illustrating examples of load impedance of a power amplifier based on input voltage according to an embodiment of the disclosure. The input voltage of FIG. 8A indicates the load impedance based on the magnitude of the voltage applied to the input end of each power amplifier (e.g., the first power amplifier 310 and the second power amplifier 320 of the Doherty power amplifier 300 of FIG. 3 or the first power amplifier 610 and the second power amplifier 620 of the Doherty power amplifier 600 of FIGS. 6A and 6B or the first power amplifier 710 and the second power amplifier 720 of the Doherty power amplifier 700 of FIGS. 7A and 7B). To ease the explanation, it is assumed that a first power amplifier (or a main amplifier, a carrier amplifier) and a second power amplifier (or an auxiliary amplifier, a peaking amplifier) of the Doherty power amplifier are symmetric ($\beta=1$).

Referring to FIG. 8A, a graph 800 includes solid lines showing a load impedance value based on the input voltage for the first power amplifier (i.e., a carrier PA), and dotted lines showing a load impedance value based on the input voltage for the second power amplifier (i.e., a peaking PA). Specifically, the graph 800 may show a first line 810 showing the first power amplifier if k (the modulation rate of the load impedance of the amplifier) is 2, a second line 820 showing the first power amplifier if k is 3, and a third line 830 showing the first power amplifier if k is 4. It shows a fourth line 815 showing the second power amplifier if k is 2, a fifth line 825 showing the second power amplifier if k is 3, and a sixth line 835 showing the second power amplifier if k is 4. A horizontal axis of the graph 800 may indicate the voltage (unit: V) of the input end voltage of the amplifier, and a vertical axis may indicate the load impedance (unit: $\Omega$).

Referring to the first line 810, if the input voltage magnitude of the first power amplifier is maximum $V_{IN, MAX}$, the load impedance may be generated at about $R_{opt}$ value. In addition, as the magnitude of the input voltage of the first power amplifier gradually reduces, the load impedance may be converged onto about $2R_{opt}$ value. At this time, a timing where the load impedance begins to converge may be the input voltage magnitude about $V_{IN, MAX}/2$ of the first power amplifier. By contrast, referring to the fourth line 815, if the input voltage magnitude of the second power amplifier is maximum $V_{IN, MAX}$, the load impedance may be generated at about $R_{opt}$ value similarly to the first power amplifier. However, as the magnitude of the input voltage of the second power amplifier gradually decreases, the load impedance may be converged to the infinity $\infty$. That is, comparing the first line 810 and the fourth line 815, if the Doherty power amplifier according to embodiments of the disclosure is in the first state (i.e., the HP state), the first power amplifier and the second power amplifier of the Doherty power amplifier both may be formed with the load impedance of about $R_{opt}$ value. In addition, if the Doherty power amplifier according to embodiments of the disclosure is in the second state (i.e., the LP state), the first power amplifier of the Doherty power amplifier may be formed with the load impedance of about $2R_{opt}$ value, and the second power amplifier may be formed with the load impedance of the infinity $\infty$.

Referring to the second line 820, if the input voltage magnitude of the first power amplifier is maximum $V_{IN,MAX}$, the load impedance may be generated at about $R_{opt}$ value. In addition, as the input voltage magnitude of the first power amplifier gradually reduces, the load impedance may be converged onto about $3 R_{opt}$ value. At this time, the load impedance may begin to converge if the input voltage magnitude of the first power amplifier is a value between about $V_{IN, MAX}/2$ and about $V_{IN, MAX}/4$. By contrast, referring to the fifth line 825, if the input voltage magnitude of the second power amplifier is maximum $V_{IN, MAX}$, the load impedance may be generated at about $R_{opt}$ value similarly to the first power amplifier. However, as the magnitude of the input voltage of the second power amplifier gradually reduces, the load impedance may be converged to the infinity $\infty$. That is, comparing the second line 820 and the fifth line 825, if the Doherty power amplifier according to embodiments of the disclosure is in the first state (i.e., the HP state), the first power amplifier and the second power amplifier of the Doherty power amplifier both may be formed with the load impedance of about $R_{opt}$ value. In addition, if the Doherty power amplifier according to embodiments of the disclosure is in the second state (i.e., the LP state), the first power amplifier of the Doherty power amplifier may be formed with the load impedance of about $3 R_{opt}$ value, and the second power amplifier may be formed with the load impedance of the infinity $\infty$.

Referring to the third line 830, if the input voltage magnitude of the first power amplifier is maximum $V_{IN, MAX}$, the load impedance may be generated at about $R_{opt}$ value. In addition, as the input voltage magnitude of the first power amplifier gradually reduces, the load impedance may be converged onto about $4R_{opt}$ value. At this time, the load impedance may begin to converge if the input voltage magnitude of the first power amplifier is about $V_{IN, MAX}/4$. By contrast, referring to the sixth line 835, if the input voltage magnitude of the second power amplifier is maximum $V_{IN, MAX}$, the load impedance may be generated at about $R_{opt}$ value similarly to the first power amplifier. However, as the magnitude of the input voltage of the second power amplifier gradually reduces, the load impedance may be converged to the infinity co. That is, comparing the third line 830 and the sixth line 835, if the Doherty power amplifier according to embodiments of the disclosure is in the first state (i.e., the HP state), the first power amplifier and the second power amplifier of the Doherty power amplifier both may be formed with the load impedance of about $R_{opt}$ value. In addition, if the Doherty power amplifier according to embodiments of the disclosure is in the second state (i.e., the LP state), the first power amplifier of the Doherty power amplifier may be formed with the load impedance of about $4R_{opt}$ value, and the second power amplifier may be formed with the load impedance of the infinity co.

FIG. 8B is a graph illustrating an example of load impedance change of the first power amplifier based on the input voltage according to an embodiment of the disclosure.

Referring to FIG. 8B, a graph 850, a first line 851 showing the load impedance change of the first power amplifier if the modulation rate k of the load impedance is 2, a second line 853 showing the load impedance change of the first power amplifier if k is 3, and a third line 855 showing the load impedance change of the first power amplifier if k is 4 are shown. Referring to the first line 851, the load impedance of the first power amplifier may be formed as a value between $R_{opt}$ in the first state (i.e., HP) and $2R_{opt}$ in the second state (i.e., LP). Referring to the second line 853, the load impedance of the first power amplifier may be formed as a value between $R_{opt}$ in the first state and $3R_{opt}$ in the second state. Referring to the third line 855, the load impedance of the first power amplifier may be formed as a value between $R_{opt}$ in the first state and $4R_{opt}$ in the second state. In other words, the first line 851 through the third line 855 may determine the range of the load impedance according to the k value. Within the determined range, the load impedance may determine the load impedance value based on the power amplifier state, that is, the output power magnitude. In addition, the back-off region improved in efficiency may be determined according to the modulation rate k of the load impedance.

FIG. 8C is a graph illustrating an example of load impedance change of the second power amplifier based on the input voltage according to an embodiment of the disclosure.

Referring to FIG. 8C, a graph 860, if reactance of the common mode network is capacitive, a first line 861 showing the load impedance change of the second power amplifier if the modulation rate k for the load impedance is 2, a second line 863 showing the load impedance change of the second power amplifier if k is 3, and a third line 865 showing the load impedance change of the second power amplifier if k is 4 are shown. Referring to the first line 861, the load impedance of the second power amplifier may be generated as a value between $R_{opt}$ in the first state (i.e., HP) and $\infty$ in the second state (i.e., LP). The first line 861 may be formed in a straight line of which the phase value is fixed to zero. Referring to the second line 863, the load impedance of the second power amplifier may be formed as a value between $R_{opt}$ in the first state to $\infty$ in the second state. Referring to the third line 865, the load impedance of the second power amplifier may be formed as a value between $R_{opt}$ in the first state to $\infty$ in the second state. The third line 865 may be formed in a curved line of which the phase value changes, and may be formed with the greater phase value change than the second line 863. In addition, referring to the second line

863 and the third line 865, the reactance of the common monde network is capacitive, and the load impedance of the second power amplifier may have a positive reactance value opposite to the reactance of the common mode network. That is, the load impedance of the second power amplifier may change with the positive phase value.

Referring to a graph 870, if the reactance of the common monde network is inductive, a fourth line 871 showing the load impedance change of the second power amplifier if the modulation rate k for the load impedance is 2, a fifth line 873 showing the load impedance change of the second power amplifier if k is 3, and a sixth line 875 showing the load impedance change of the second power amplifier if k is 4 are shown. Referring to the fourth line 871, the load impedance of the second power amplifier may be formed as a value between $R_{opt}$ in the first state (i.e., HP) and ∞ in the second state (i.e., LP). The fourth line 871 may be formed in a straight line of which the phase value is fixed to zero. Referring to the fifth line 873, the load impedance of the second power amplifier may be formed as a value between $R_{opt}$ in the first state to ∞ in the second state. The fifth line 873 may be formed in a curved line of which the phase value changes. Referring to the sixth line 875, the load impedance of the second power amplifier may be formed as a value between $R_{opt}$ in the first state to ∞ in the second state. The sixth line 875 may be formed as a curved line of which the phase value changes, and may be formed with the greater phase value change than the fifth line 873. In addition, referring to the fifth line 873 and the sixth line 875, the reactance of the common monde network is inductive, and the load impedance of the second power amplifier may have a negative reactance value opposite to the reactance of the common mode network. That is, the load impedance of the second power amplifier may change with the negative phase value.

As above, the Doherty power amplifier using the common mode according to embodiments of the disclosure may output the maximum output power in the first state of the power amplifier, using the voltage summing power combining and the common mode characteristic. In addition, the power amplifier may achieve the wide back-off region by adjusting the modulation rate of the load impedance in the second state. The modulation rate of the load impedance may be related to the common mode network and the first matching network. As the modulation rate of the load impedance is adjusted, the back-off power value may be adjusted. Hereafter, the change of the PAE based on the modulation rate change shall be explained in FIG. 9.

FIG. 9 is a graph illustrating an example of PAE based on an input voltage of a Doherty power amplifier using a common mode according to an embodiment of the disclosure. The Doherty power amplifier using the common mode may indicate a structure which connects the common mode network to each output end of the first power amplifier and the second power amplifier of the Doherty power amplifier. To ease the description, it is described assuming that the first power amplifier and the second power amplifier of the Doherty power amplifier are symmetric ($\beta$=1). A horizontal axis of a graph 900 indicates the magnitude (unit: V) of the input voltage of the amplifier, and a vertical axis indicate the PAE (unit: %).

Referring to FIG. 9, the graph 900, a first line 910 indicating the PAE change if the modulation rate k for the load impedance of the power amplifier is 2, a second line 920 indicating the PAE change if k is 3, and a third line 930 indicating the PAE change if k is 4 are shown. Referring to the first line 910, if the magnitude of the input voltage of the amplifier is maximum $V_{IN,\ MAX}$ (i.e., the output of the amplifier is maximum), the PAE may be generated at about 80%. In addition, if the magnitude of the input voltage of the amplifier is maximum $V_{IN,MAX}/2$, the PAE may be generated at about 80% similarly to the maximum magnitude of the input voltage. This may indicate that the back-off power region improved in the amplifier efficiency is about 6 dB, if k=2. Referring to the second line 920, if the magnitude of the input voltage of the amplifier is maximum $V_{IN,\ MAX}$ (i.e., the output of the amplifier is maximum), the PAE may be generated at about 80%. In addition, the magnitude of the input voltage of the amplifier is a value between about $V_{IN,\ MAX}/2$ and about $V_{IN,\ MAX}/4$, the PAE may be generated at about 80% similarly to the maximum magnitude of the input voltage. This may indicate that the back-off power region improved in the amplifier efficiency is generated at about 8 dB, if k=3. Referring to the third line 930, if the magnitude of the input voltage of the amplifier is maximum $V_{IN,\ MAX}$ (i.e., the output of the amplifier is maximum), the PAE may be generated at about 80%. In addition, if the magnitude of the input voltage of the amplifier is a value of about $V_{IN,\ MAX}/4$, the PAE may be generated at about 80% similarly to the maximum magnitude of the input voltage. This may indicate that the back-off power region improved in the amplifier efficiency is about 9 dB, if k=4.

As above, in the Doherty power amplifier coupled with the modulation impedance according to embodiments of the disclosure, as the modulation rate for the load impedance of the amplifier is adjusted, the load impedance value may be adjusted. Specifically, in the second state of the Doherty power amplifier, as the modulation rate for the load impedance of the amplifier is adjusted, the value at which the load impedance of the first power amplifier is converged by the modulation rate may be determined. Hence, as explained in FIGS. 6B and 7B, by adjusting the reactance of the common mode network and the electrical length of the first matching network, the intended modulation rate k of the amplifier load impedance may be determined. In addition, modulating the load impedance of the amplifier may indicate that the modulation rate is adjustable and the back-off power region value of the improved efficiency is adjustable. That is, amplifier performance may be improved by expanding the high-efficiency back-off region of the amplifier.

The Doherty power amplifier using the common monde according to embodiments of the disclosure may have the expanded high-efficiency back-off region, unlike a conventional amplifier structure (e.g., class-AB, Doherty power amplifier). Specifically, the Doherty power amplifier using the common monde according to embodiments of the disclosure may be the structure which arranges the common mode network interconnecting the first path extended from the output end of the first power amplifier (or the main amplifier, the carrier amplifier) and the second path extended from the output end of the second power amplifier (or the auxiliary amplifier, the peaking amplifier). The Doherty power amplifier of the disclosure may be designed to electrically separate the first path and the second path using the common mode characteristic of the common mode network in the first state (i.e., the HP state), and to apply the optimal load impedance for each power amplifier, thus output the maximum output power in the first state of the power amplifier. In addition, the Doherty power amplifier of the disclosure may determine the modulation rate of the load impedance by adjusting the element value of the transmission line (i.e., the first matching network) connected to the common mode network and the output end of the first power amplifier in the second state (i.e., the LP state), and accordingly achieve a wider back-off region improved in the efficiency. Hence, the power amplifier of the disclosure may be used in a signal of a modulation scheme having high PAPR according to development of a wireless communication system, and minimize the power consumption. Thus, an electronic device (e.g., a base station, a terminal, etc.) including the Doherty power amplifier structure according to embodiments of the disclosure may minimize power consumption, reduce heating, and increase battery lifetime.

FIG. 10 illustrates a functional configuration of an electronic device according to an embodiment of the disclosure. An electronic device 1010 may be one of a base station or a terminal. According to an embodiment, the electronic device 1010 may be a massive MIMO unit (MMU) or a mm Wave device.

Referring to FIG. 10, a functional configuration of the electronic device 1010 is illustrated. The electronic device 1010 may include an antenna unit 1011, a filter unit 1012, an RF processing unit 1013, and a control unit 1014.

The antenna unit 1011 may include a plurality of antennas. The antenna performs functions for transmitting and receiving signals over a radio channel. The antenna may include a conductive formed on a substrate (e.g., a printed circuit board (PCB)) or a radiator formed in a conductive pattern. The antenna may radiate an upconverted signal or obtain a signal radiated by other device over the radio channel. Each antenna may be referred to as an antenna element or an antenna device. In some embodiments, the antenna unit 1011 may include an antenna array (e.g., a sub array) in which a plurality of antenna elements is arrayed. The antenna unit 1011 may be electrically connected with the filter unit 1012 through RF signal lines. The antenna unit 1011 may be mounted on a PCB including a plurality of antenna elements. The PCB may include the plurality of the RF signal lines connecting each antenna element with a filter of the filter unit 1012. Such RF signa lines may be referred to as a feeding network. The antenna unit 1011 may provide a received signal to the filter unit 1012 or radiate a signal provided from the filter unit 1012 over the air.

The antenna unit 1011 according to various embodiments may include at least one antenna module having a dual polarization antenna. The dual polarization antenna may be, for example, a cross-pole (x-pol) antenna. The dual polarization antenna may include two antenna elements corresponding to different polarizations. For example, the dual polarization antenna may include a first antenna element having the polarization of +45° and a second antenna element having the polarization of −45°. It is noted that the polarizations may be formed with other orthogonal polarizations than +45° and −45°. Each antenna element may be connected with a feeding line, and may be electrically connected with the filter unit 1012, the RF processing unit 1013, and the control unit 1014 to be described.

According to an embodiment, the dual polarization antenna may be a patch antenna (or a microstrip antenna). The dual polarization antenna, which has the patch antenna form, may be easily implemented and integrated as the array antenna. Two signals having different polarizations may be inputted to respective antenna ports. Each antenna port corresponds to the antenna element. For high efficiency, it is required to optimize relationship of co-pol characteristics and cross-pol characteristics between the two signals having the different polarizations. In the dual polarization antenna, the co-pol characteristics indicate characteristics of a specific polarization component and the cross-pol characteristics indicate characteristics of other polarization component than the specific polarization component.

The filter unit 1012 may perform filtering, to forward a signal of an intended frequency. The filter unit 1012 may perform a function for selectively identifying the frequency by generating resonance. In some embodiment, the filter unit 1012 may generate the resonance through a cavity structurally including a dielectric. Also, the filter unit 1012 may generate the resonance through elements which generate inductance or capacitance in some embodiments. In addition, in some embodiment, the filter unit 1012 may include an elastic filter such as a bulk acoustic wave (BAW) filter or a surface acoustic wave (SAW) filter. The filter unit 1012 may include at least one of a band pass filter, a low pass filter, a high pass filter, or a band reject filter. That is, the filter unit 1012 may include RF circuits for acquiring the signal of the frequency band for transmission or the frequency band for reception. The filter unit 1012 according to various embodiments may electrically connect the antenna unit 1011 and the RF processing unit 1013.

The RF processing unit 1013 may include a plurality of RF paths. The RF path may be a unit of a path through which the signal received via the antenna or the signal radiated via the antenna passes. At least one RF path may be referred to as an RF chain. The RF chain may include a plurality of RF elements. The RF elements may include an amplifier, a mixer, an oscillator, a digital-to-analog converter (DAC), an analog-to-digital converter (ADC), or the like. For example, the RF processing unit 1013 may include an up converter which upconverts a digital transmit signal of a base band into a transmission frequency, and a DAC which converts the upconverted digital transmit signal into an analog RF transmit signal. The up converter and the DAC form a part of the transmission path. The transmission path may further include a power amplifier (PA) or a coupler (or a combiner). In addition, for example, the RF processing unit 1013 may include an ADC which converts an analog RF receive signal into a digital receive signal, and a down converter which converts the digital receive signal into the digital receive signal of the base band. The ADC and the down converter form a part of the reception path. The reception path may further include a low-noise amplifier (LNA) or a coupler (or a divider). RF parts of the RF processing unit may be implemented on the PCB. The electronic device 1010 may include a structure in which the antenna unit 1011, the filter unit 1012, and the RF processing unit 1013 are stacked in order. The antennas and the RF parts of the RF processing unit may be implemented on the PCB, and filters may be repeatedly coupled between the PCB and the PCB to form a plurality of layers. The Doherty power amplifier using the common mode according to embodiments of the disclosure may be included in the RF processing unit 1013 of FIG. 10.

The control unit 1014 may control general operations of the electronic device 1010. The control unit 1014 may include various modules for performing the communication. The control unit 1014 may include at least one processor such as a modem. The control unit 1014 may include modules for digital signal processing. For example, the control unit 1014 may include a modem. In data transmission, the control unit 1014 generates complex symbols by encoding and modulating a transmit bit string. In addition, for example, in data reception, the control unit 1014 may restore a receive bit string by demodulating and decoding a base band signal. The control unit 1014 may perform functions of a protocol stack required by the communication standard.

FIG. 10 has described the functional configuration of the electronic device 1010, as the equipment for utilizing the amplifier structure of the disclosure. However, the example illustrated in FIG. 10 is simply the configuration for utilizing the Doherty power amplifier structure and the electronic device including the same according to embodiments of the disclosure described in FIGS. 1, 2A, 2B, 2C, 3, 4A, 4B, 5A, 5B, 6A, 6B, 7A, 7B, 8A, 8B, 8C, and 9, and the embodiments of the disclosure are not limited to the components of the equipment shown in FIG. 10. Hence, the Doherty power amplifier structure according to embodiments of the disclosure, the electronic device including the Doherty power amplifier structure, and communication equipment of other configuration including the same may be also understood as an embodiment of the disclosure.

According to an embodiment of the disclosure as set forth above, a Doherty power amplifier of a wireless communication system may include a first power amplifier, a second power amplifier, a first transmission line connected to an output end of the first power amplifier, a second transmission line connected to an input end of the second power amplifier, a first network and a second network, the first network may interconnect a first node connected with one end of the first transmission line and a second node connected with an output end of the second power amplifier, the one end of the first transmission line may be positioned on an opposite side with respect to the output end of the first power amplifier, and the second network may connect the first node, the second node, and a third node which is an output end of the Doherty power amplifier.

In an embodiment, the first power amplifier may be a class-AB power amplifier, and the second power amplifier may be a class-C power amplifier.

In an embodiment, the first network may include at least one of a lumped element, a distributed element, or a combination of the lumped element and the distributed element.

In an embodiment, the second network may include a third transmission line, and a fourth transmission line, the third transmission line may be connected with the first node, the fourth transmission line may be connected with the second node, and the third transmission line and the fourth transmission line may be connected with the third node at an arbitrary point.

In an embodiment, if the first power amplifier and the second power amplifier operate with maximum output power, a characteristic impedance ratio of the third transmission line and the fourth transmission line may be determined based on a maximum output power ratio of the first power amplifier and the second power amplifier.

In an embodiment, if the second power amplifier does not operate, an electrical length of the first transmission line and a reactance value of the first network may be determined based on a maximum output power ratio of the first power amplifier and the second power amplifier and a modulation rate of load impedance of the first power amplifier.

In an embodiment, the second network may include a first transformer interconnecting the first node and the third node and a second transformer interconnecting the second node and the third node.

In an embodiment, if the first power amplifier and the second power amplifier operate with maximum output power, a first turns ratio of the first transformer and a second turns ratio of the second transformer may be determined based on characteristic impedance of the first transmission line, load impedance of the Doherty power amplifier and a maximum output power ratio of the first power amplifier and the second power amplifier.

In an embodiment, if the second power amplifier does not operate, an electrical length of the first transmission line and a reactance value of the first network may be determined based on a maximum output power ratio of the first power amplifier and the second power amplifier and a modulation rate of load impedance of the first power amplifier.

In an embodiment, an electrical length of the first transmission line may be equal to an electrical length of the second transmission line.

According to an embodiment of the disclosure as set forth above, an electronic device of a wireless communication system may include at least one processor, a plurality of RF chains connected with the at least one processor and a plurality of antenna elements connected with the plurality of the RF chains, a first RF chain of the plurality of the RF chains may include a Doherty power amplifier, the Doherty power amplifier may include a first power amplifier, a second power amplifier, a first transmission line connected to an output end of the first power amplifier, a second transmission line connected to an input end of the second power amplifier, a first network and a second network, the first network may interconnect a first node connected with one end of the first transmission line and a second node connected with an output end of the second power amplifier, the one end of the first transmission line may be positioned on an opposite side with respect to the output end of the first power amplifier, and the second network may connect the first node, the second node, and a third node which is an output end of the Doherty power amplifier.

In an embodiment, the first power amplifier may be a class-AB power amplifier, and the second power amplifier may be a class-C power amplifier.

In an embodiment, the first network may include at least one of a lumped element, a distributed element, or a combination of the lumped element and the distributed element.

In an embodiment, the second network may include a third transmission line, and a fourth transmission line, the third transmission line may be connected with the first node, the fourth transmission line may be connected with the second node, and the third transmission line and the fourth transmission line may be connected with the third node at an arbitrary point.

In an embodiment, if the first power amplifier and the second power amplifier operate with maximum output power, a characteristic impedance ratio of the third transmission line and the fourth transmission line may be determined based on a maximum output power ratio of the first power amplifier and the second power amplifier.

In an embodiment, if the second power amplifier does not operate, an electrical length of the first transmission line and a reactance value of the first network may be determined based on a maximum output power ratio of the first power amplifier and the second power amplifier and a modulation rate of load impedance of the first power amplifier.

In an embodiment, the second network may include a first transformer interconnecting the first node and the third node and a second transformer interconnecting the second node and the third node.

In an embodiment, if the first power amplifier and the second power amplifier operate with maximum output power, a first turns ratio of the first transformer and a second turns ratio of the second transformer may be determined based on characteristic impedance of the first transmission line, load impedance of the Doherty power amplifier and a maximum output power ratio of the first power amplifier and the second power amplifier.

In an embodiment, if the second power amplifier does not operate, an electrical length of the first transmission line and a reactance value of the first network may be determined based on a maximum output power ratio of the first power amplifier and the second power amplifier and a modulation rate of load impedance of the first power amplifier.

In an embodiment, an electrical length of the first transmission line may be equal to an electrical length of the second transmission line.

The methods according to the embodiments described in the claims or the specification of the disclosure may be implemented in software, hardware, or a combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the disclosure.

Such a program (software module, software) may be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. Alternatively, it may be stored to a memory combining part or all of those recording media. In addition, a plurality of memories may be included.

Also, the program may be stored in an attachable storage device accessible via a communication network such as Internet, Intranet, local area network (LAN), wide LAN (WLAN), or storage area network (SAN), or a communication network by combining these networks. Such a storage device may access a device which executes an embodiment of the disclosure through an external port. In addition, a separate storage device on the communication network may access the device which executes an embodiment of the disclosure.

In the specific embodiments of the disclosure, the elements included in the disclosure are expressed in a singular or plural form. However, the singular or plural expression is appropriately selected according to a proposed situation for the convenience of explanation, the disclosure is not limited to a single element or a plurality of elements, the elements expressed in the plural form may be configured as a single element, and the elements expressed in the singular form may be configured as a plurality of elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A Doherty power amplifier of a wireless communication system, the Doherty power amplifier comprising:
   a power divider dividing an input signal and outputting a first divided signal to a first transmission line, and a second divided signal to a second transmission line;
   a first power amplifier receiving the first divided signal via the first transmission line, and outputting a first output signal to a first node via a first impedance matching circuit, in both of a high power state and a low power state;
   a second power amplifier receiving the second divided signal via the second transmission line, and outputting a second output signal to a second node via a second impedance matching circuit, in the low power state;

a power combining circuit combing a first power input received from the first node and a second power input received from the second node, and outputting a combined signal; and
   a common mode circuit configured with reactance component connecting the first node and the second node,
   wherein the second transmission line includes a phase compensating circuit compensating phase difference between the first power amplifier and the second power amplifier, and
   wherein, the common mode circuit electrically separates the first node and the second node, in case that the Doherty power amplifier operates in the high power state.

2. The Doherty power amplifier of claim 1,
   wherein the first power amplifier is a class-AB power amplifier, and
   wherein the second power amplifier is a class-C power amplifier.

3. The Doherty power amplifier of claim 1, wherein the common mode circuit comprises at least one of a lumped element, a distributed element, or a combination of the lumped element and the distributed element.

4. The Doherty power amplifier of claim 1,
   wherein the power combining circuit comprises a third impedance matching circuit and a fourth impedance matching circuit, and
   wherein the third impedance matching circuit and the fourth impedance matching circuit are connected with an output node of the power combining circuit at an arbitrary point.

5. The Doherty power amplifier of claim 4, wherein, in case that the Doherty power amplifier operates in the high power state, a characteristic impedance ratio of the third impedance matching circuit and the fourth impedance matching circuit is determined based on a maximum output power ratio of the first power amplifier and the second power amplifier.

6. The Doherty power amplifier of claim 4, wherein, in case that the Doherty power amplifier operates in the low power state, an electrical length of the first impedance matching circuit and a reactance value of the common mode circuit are determined based on a maximum output power ratio of the first power amplifier and the second power amplifier and a modulation rate of load impedance of the first power amplifier.

7. The Doherty power amplifier of claim 1, wherein the power combining circuit comprises a first transformer connecting the first node and an output node of the power combining circuit and a second transformer connecting the second node and the third output node.

8. The Doherty power amplifier of claim 7, wherein, in case that the Doherty power amplifier operates in the high power state, a first turns ratio of the first transformer and a second turns ratio of the second transformer are determined based on characteristic impedance of the first impedance matching circuit, load impedance of the Doherty power amplifier and a maximum output power ratio of the first power amplifier and the second power amplifier.

9. The Doherty power amplifier of claim 7, wherein, in case that the Doherty power amplifier operates in the low power state, an electrical length of the first impedance matching circuit and a reactance value of the common mode circuit first are determined based on a maximum output power ratio of the first power amplifier and the second power amplifier and a modulation rate of load impedance of the first power amplifier.

10. The Doherty power amplifier of claim 1, wherein an electrical length of the first impedance matching circuit is equal to an electrical length of the second transmission line.

11. An electronic device of a wireless communication system, the electronic device comprising:

at least one processor;

a plurality of radio frequency (RF) chains connected with the at least one processor; and a plurality of antenna elements connected with the plurality of the RF chains, wherein a first RF chain of the plurality of the RF chains comprises a Doherty power amplifier, wherein the Doherty power amplifier comprises:

a power divider dividing an input signal and outputting a first divided signal to a first transmission line, and a second divided signal to a second transmission line, a first power amplifier receiving the first divided signal via the first transmission line, and outputting a first output signal to a first node via a first impedance matching circuit, in both of a high power state and a low power state, a second power amplifier receiving the second divided signal via the second transmission line, and outputting a second output signal to a second node via a second impedance matching circuit, in the low power state, a power combining circuit combing a first power input received from the first node and a second power input received from the second node, and outputting a combined signal, and a common mode circuit configured with reactance component connecting the first node and the second node, wherein the second transmission line includes a phase compensating circuit compensating phase difference between the first power amplifier and the second power amplifier, and wherein, the common mode circuit electrically separates the first node and the second node, in case that the Doherty power amplifier operates in the high power state.

12. The electronic device of claim 11, wherein the first power amplifier is a class-AB power amplifier, and wherein the second power amplifier is a class-C power amplifier.

13. The electronic device of claim 11 wherein the common mode circuit comprises at least one of a lumped element, a distributed element, or a combination of the lumped element and the distributed element.

14. The electronic device of claim 11, wherein the power combining circuit comprises a third impedance matching circuit transmission line and a fourth impedance matching circuit, and wherein the third impedance matching circuit and the fourth impedance matching circuit are connected with an output node of the power combining circuit at an arbitrary point.

15. The electronic device of claim 14, wherein, in case that the Doherty power amplifier operates in the high power state, a characteristic impedance ratio of the third impedance matching circuit and the fourth impedance matching circuit is determined based on a maximum output power ratio of the first power amplifier and the second power amplifier.

16. The electronic device of claim 14, wherein, in case that the Doherty power amplifier operates in the low power state, an electrical length of the first impedance matching circuit and a reactance value of the common mode circuit are determined based on a maximum output power ratio of the first power amplifier and the second power amplifier and a modulation rate of load impedance of the first power amplifier.

17. The electronic device of claim 11, wherein the power combining circuit comprises a first transformer connecting the first node and an output node of the power combining circuit and a second transformer connecting the second node and the output node.

18. The electronic device of claim 17, wherein, in case that the Doherty power amplifier operates in the high power state, a first turns ratio of the first transformer and a second turns ratio of the second transformer are determined based on characteristic impedance of the first impedance matching circuit, load impedance of the Doherty power amplifier and a maximum output power ratio of the first power amplifier and the second power amplifier.

19. The electronic device of claim 17, wherein, in case that the Doherty power amplifier operates in the low power state, an electrical length of the first impedance matching circuit and a reactance value of the common mode circuit are determined based on a maximum output power ratio of the first power amplifier and the second power amplifier and a modulation rate of load impedance of the first power amplifier.

20. The electronic device of claim 11, wherein an electrical length of the first impedance matching circuit is equal to an electrical length of the second transmission line.

* * * * *